(12) United States Patent
Teramoto et al.

(10) Patent No.: US 6,710,659 B2
(45) Date of Patent: Mar. 23, 2004

(54) VARIABLE-GAIN AMPLIFIER WITH STEPWISE CONTROLLER

(75) Inventors: Makoto Teramoto, Osaka (JP); Mamoru Shimoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/216,873

(22) Filed: Aug. 13, 2002

(65) Prior Publication Data

US 2003/0038677 A1 Feb. 27, 2003

(30) Foreign Application Priority Data

Aug. 21, 2001 (JP) ........................................ 2001-250033
Sep. 10, 2001 (JP) ........................................ 2001-272988

(51) Int. Cl.[7] .............................................. H03G 11/08
(52) U.S. Cl. ........................ 330/254; 330/261; 330/278; 330/285; 327/52
(58) Field of Search ................................ 330/254, 261, 330/278, 285; 327/359, 52, 65

(56) References Cited

U.S. PATENT DOCUMENTS

| | | | | |
|---|---|---|---|---|
| 5,587,689 A | * | 12/1996 | Bowers | 330/254 |
| 5,748,027 A | * | 5/1998 | Cargill | 327/350 |
| 5,933,771 A | * | 8/1999 | Tiller et al. | 455/333 |
| 6,316,996 B1 | * | 11/2001 | Puotiniemi | 330/254 |
| 6,452,449 B1 | * | 9/2002 | Saito | 330/254 |

FOREIGN PATENT DOCUMENTS

JP     2000-183674     6/2000

OTHER PUBLICATIONS

Jayarman et al., "A Fully Integrated Broadband Direct–Conversation Receiver for DBS Applications", ISSCC 2000 Paper TA8.2, 5 pages (Feb. 8, 2000).

* cited by examiner

Primary Examiner—Timothy P. Callahan
Assistant Examiner—An T. Luu
(74) Attorney, Agent, or Firm—Birch, Stewart, Kolasch & Birch, LLP

(57) ABSTRACT

In a conventional variable-gain amplifier, when high-frequency signals are fed in, leak current flows through the collector-emitter parasitic capacitance of transistors, making it impossible to attenuate the gain sufficiently. A variable-gain amplifier of the invention has a controller for controlling the operation of input transistors so as to reduce the leak current that flows through transistors because of their collector-emitter parasitic capacitance when high-frequency signals are fed in and thereby prevent saturation of gain attenuation. Another variable-gain amplifier of the invention has a plurality of variable-gain amplifier circuits connected in parallel, and has a current control circuit for controlling the bias current sources provided within each of the variable-gain amplifier circuits so as to reduce the leak current that flows through transistors because of their collector-emitter parasitic capacitance when high-frequency signals are fed in and thereby prevent saturation of gain attenuation.

17 Claims, 16 Drawing Sheets

CONTROL VOLTAGE $V_{C1}$

VARIABLE-GAIN AMPLIFIER WITH STEPWISE CONTROLLER

BACKGROUND OF THE INVENTION

1. Field of the Invention

The present invention relates to a variable-gain amplifier, i.e., an amplifier that permits its gain to be controlled, for use in an integrated circuit, and more particularly to a variable-gain amplifier for use in an integrated circuit for receiving digital satellite broadcasts.

2. Description of the Prior Art

FIG. 16 shows an example of the configuration of a conventional variable-gain amplifier. An input voltage signal $V_{IN1}$ is fed to a terminal that is connected to the base of an NPN-type input transistor Q1, and an input voltage signal $V_{IN2}$ is fed to a terminal that is connected to the base of an NPN-type input transistor Q2. The emitters of the input transistors Q1 and Q2 are connected together through a resistor RE1. The emitter of the input transistor Q1 is grounded through a constant current source 1 that outputs a constant current $I_C$, and the emitter of the input transistor Q2 is grounded through a constant current source 2 that outputs a constant current $I_C$.

To the collector of the input transistor Q1, the emitters of NPN-type transistors Q3 and Q4 are connected. To the collector of the input transistor Q2, the emitters of NPN-type transistors Q5 and Q6 are connected.

A constant voltage $V_{CC}$ is supplied to a terminal that is connected to one end of a resistor RL1, to the collector of the transistor Q4, to the collector of the transistor Q5, and to one end of a resistor RL2. The other end of the resistor RL1 is connected to the collector of the transistor Q3 and to a terminal from which an output voltage signal $V_{OUT1}$ is fed out, and the other end of the resistor RL2 is connected to the collector of the transistor Q6 and to a terminal from which an output voltage signal $V_{OUT2}$ is fed out.

A reference voltage $V_{B1}$ is supplied to a terminal that is connected to the base of the transistor Q3 and to the base of the transistor Q6. A control voltage $V_{C1}$ is supplied to a terminal that is connected to the base of the transistor Q4 and to the base of the transistor Q5.

Next, the operation of the variable-gain amplifier of FIG. 16 will be described. When the levels of the input voltage signals $V_{IN1}$ and $V_{IN2}$ are low, the control voltage $V_{C1}$ is reduced so that the base potential of the transistors Q3 and Q6 is higher than the base potential of the transistors Q4 and Q5. As a result, almost no current flows through the transistors Q4 and Q5, and most of the collector current of the input transistors flows through the transistors Q3 and Q6. Accordingly, a large amount of current flows through the output load resistors RL1 and RL2, yielding a high gain.

On the other hand, when the levels of the input voltage signals $V_{IN1}$ and $V_{IN2}$ are high, the control voltage $V_{C1}$ is increased so that the base potential of the transistors Q3 and Q6 is lower than the base potential of the transistors Q4 and Q5. As a result, most of the collector current of the input transistors flows through the transistors Q4 and Q5, and almost no current flows through the transistors Q3 and Q6. Accordingly, a small amount of current flows through the output load resistors RL1 and RL2, yielding a low gain. Thus, the gain characteristic curve T1 of the variable-gain amplifier of FIG. 16 with respect to the control voltage $V_{C1}$ is as shown in FIG. 17. In FIG. 17, the symbol $V_{th1}$ represents the threshold level of the control voltage $V_{C1}$ at which the variable-gain amplifier of FIG. 16 starts attenuating its gain.

When the variable-gain amplifier is used in a digital satellite broadcast system or terrestrial broadcast system, the input voltage signals $V_{IN1}$ and $V_{IN2}$ are high-frequency signals having frequencies of from about a few hundred MHz to a few GHz. Moreover, in a digital satellite broadcast system or terrestrial broadcast system, a wide dynamic range of typically 60 dB or over is required.

However, in the variable-gain amplifier of FIG. 16, when high-frequency signals are fed in, leak current flows through the collector-emitter parasitic capacitance (about a few tens of fF) of the transistors Q3 and Q6. This causes saturation of gain attenuation, and thus the gain characteristic curve T2 of the variable-gain amplifier with respect to the control voltage $V_{C1}$ when high-frequency signals are fed in is as shown in FIG. 18.

In this way, the variable-gain amplifier of FIG. 16 cannot attenuate its gain sufficiently when high-frequency signals are fed in, and thus, quite inconveniently, does not offer a wide input dynamic range as required in a digital satellite broadcast system or terrestrial broadcast system.

FIG. 19 shows another example of the configuration of a conventional variable-gain amplifier. The variable-gain amplifier of FIG. 19 is provided with a variable-gain amplifier circuit A1 and a variable-gain amplifier circuit A2.

First, the configuration of the variable-gain amplifier circuit A1 will be described. An input signal $V_{in1}$ is fed to a terminal that is connected to the base of an NPN-type input transistor Q21, and an input signal $V_{in2}$ is fed to a terminal that is connected to the base of an NPN-type input transistor Q22. The emitters of the input transistors Q21 and Q22 are connected together through a resistor R7. The emitter of the input transistor Q21 is grounded through a constant current source 21 that produces a bias current $I_C$, and the emitter of the input transistor Q22 is grounded through a constant current source 22 that produces a bias current $I_C$.

To the collector of the input transistor Q21, the emitters of NPN-type transistors Q14 and Q15 are connected. To the collector of the input transistor Q22, the emitters of NPN-type transistors Q16 and Q17 are connected.

A constant voltage $V_{CC}$ is supplied to a terminal that is connected to the collectors of the transistors Q15 and Q16.

A bias voltage $V_{bias}$ is supplied to a terminal that is connected to the bases of the transistors Q14 and Q17. A control voltage $V_{AGC}$, which is a reference control voltage, is supplied to a terminal that is connected to the bases of the transistors Q15 and Q16.

Next, the configuration of the variable-gain amplifier circuit A2 will be described. The terminal to which the input signal $V_{in1}$ is fed is connected to the base of an NPN-type input transistor Q20, and the terminal to which the input signal $V_{in2}$ is fed is connected to the base of an NPN-type input transistor Q23. The emitters of the input transistors Q20 and Q23 are connected together through a resistor R8. The emitter of the input transistor Q20 is grounded through a constant current source 20 that produces a bias current $I_C$, and the emitter of the input transistor Q23 is grounded through a constant current source 23 that produces a bias current $I_C$.

To the collector of the input transistor Q20, the emitters of NPN-type transistors Q12 and Q13 are connected. To the collector of the input transistor Q23, the emitters of NPN-type transistors Q18 and Q19 are connected.

The terminal to which the constant voltage $V_{CC}$ is supplied is connected to one end of an output load resistor R5, to the collector of the transistor Q13, to the collector of the transistor Q18, and to one end of an output load resistor R6. The other end of the output load resistor R5 is connected to the collector of the transistor Q12, and the other end of the output load resistor R6 is connected to the collector of the input transistor Q19.

The terminal to which the bias voltage $V_{bias}$ is supplied is connected to the bases of the transistors Q12 and Q19. The terminal to which the control voltage $V_{AGC}$ is supplied is connected through a resistor R3 to the bases of the transistors Q13 and Q18. The node between the resistor R3 and the transistors Q3 and Q8 is grounded through a resistor R4.

The variable-gain amplifier circuits A1 and A2 configured as described above are connected in parallel. Superficially, the collectors of the transistors Q12 and Q14 are both connected to a terminal from which an output signal $V_{out1}$ is fed out, and the collectors of the transistors Q17 and Q19 are both connected to a terminal from which an output signal $V_{out2}$ is fed out.

In the variable-gain amplifier circuits A1 and A2, there is a tradeoff between noise factor and intermodulation distortion characteristics. Therefore, the variable-gain amplifier circuit A1 is designed to offer good noise factor characteristics, and the variable-gain amplifier circuit A2 is designed to offer good intermodulation distortion characteristics.

Next, the operation of the variable-gain amplifier of FIG. 19 will be described. When the levels of the input signals $V_{in1}$ and $V_{in2}$ are low, the control voltage $V_{AGC}$ is reduced so that the base potential of the transistors Q12, Q14, Q17, and Q19 is higher than the base potential of the transistors Q13, Q15, Q16, and Q18. As a result, almost no current flows through the transistors Q13, Q15, Q16, and Q18, and most of the collector current of the input transistors flows through the transistors Q12, Q14, Q17, and Q19. Accordingly, a large amount of current flows through the output load resistors R5 and R6, and thus the variable-gain amplifier yields a high gain.

On the other hand, when the levels of the input signals $V_{in1}$ and $V_{in2}$ are high, the control voltage $V_{AGC}$ is increased so that the base potential of the transistors Q12, Q14, Q17, and Q19 is lower than the base potential of the transistors Q13, Q15, Q16, and Q18. As a result, most of the collector current of the input transistors flows through the transistors Q13, Q15, Q16, and Q18, and almost no current flows through the transistors Q12, Q14, Q17, and Q19. Accordingly, a small amount of current flows through the output load resistors R5 and R6, and thus the variable-gain amplifier yields a low gain.

Moreover, since the control voltage $V_{AGC}$ is applied to the bases of the transistors Q15 and Q16, and a division voltage of the control voltage $V_{AGC}$ is applied to the bases of the transistors Q13 and Q18, the variable-gain amplifier circuits A1 and A2 start attenuating their gains at different threshold levels of the control voltage $V_{AGC}$. Let the threshold level of the control voltage $V_{AGC}$ at which the variable-gain amplifier circuit A1 starts attenuating its gain be $V_{b1}$, and the threshold level of the control voltage $V_{AGC}$ at which the variable-gain amplifier circuit A2 starts attenuating its gain be $V_{b2}$ ($V_{b1}<V_{b2}$). The potential difference between $V_{b1}$ and $V_{b2}$ equals the potential difference between the two ends of the resistor R3.

Since the variable-gain amplifier circuits A1 and A2 are connected in parallel, the gain $G_{total}$ of the variable-gain amplifier of FIG. 19 equals the sum of the gain $G_{A1}$ of the variable-gain amplifier circuit A1 and the gain $G_{A2}$ of the variable-gain amplifier circuit A2. Thus, the gain $G_{total}$ of the conventional variable-gain amplifier with respect to the control voltage $V_{AGC}$ shows a characteristic curve as shown in FIG. 20. Here, in a region where the levels of the input signals are low, i.e., when the control voltage $V_{AGC}$ is low, the $G_{A1}$ of the variable-gain amplifier circuit A1 is predominant, offering good noise figure characteristics; in a region where the levels of the input signals are high, i.e., when the control voltage $V_{AGC}$ is high, the $G_{A2}$ of the variable-gain amplifier circuit A2 is predominant, offering good intermodulation distortion characteristics.

However, the variable-gain amplifier of FIG. 19 has the following two disadvantages. The first is the degradation of intermodulation distortion characteristics when high-frequency signals are fed in. The second is the voltage drops across output load resistors increasing as more and more variable-gain amplifier circuits are connected in parallel.

The cause of the first disadvantage, i.e., the degradation of intermodulation distortion characteristics when high-frequency signals are fed in, will be described.

In the variable-gain amplifier of FIG. 19, when the control voltage $V_{AGC}$ becomes higher than the threshold level $V_{b1}$ at which the variable-gain amplifier circuit A1 starts attenuating its gain, the current flowing through the transistors Q14 and Q17 decreases, attenuating the gain of the variable-gain amplifier circuit A1. However, since the constant current sources 21 and 22 supply a constant bias current $I_C$ irrespective of the level of the control voltage $V_{AGC}$, the signal amplified by the input transistor Q21 is fed to the emitter of the transistor Q14, and the signal amplified by the input transistor Q22 is fed to the emitter of the transistor Q17.

When high-frequency signals are fed in, the signal amplified by the input transistor Q21 leaks through the emitter-collector parasitic capacitance of the transistor Q14 to the output load resistor R5, and the signal amplified by the input transistor Q22 leaks through the emitter-collector parasitic capacitance of the transistor Q17 to the output load resistor R6.

Thus, when high-frequency signals are fed in, even if the control voltage $V_{AGC}$ is increased, the gain attenuation of the variable-gain amplifier circuit A1 is saturated as shown in FIG. 21. This makes the gain difference D between the variable-gain amplifier circuits A1 and A2 smaller in a range in which the control voltage $V_{AGC}$ is high. When high-frequency signals are fed in, the gain attenuation of the variable-gain amplifier circuit A2 also is saturated. However, when saturated, the gain of the variable-gain amplifier circuit A2 almost equals zero, and therefore, in the following description, the gain attenuation of this variable-gain amplifier circuit A2 is assumed not to be saturated.

Now, how the smaller gain difference D degrades intermodulation distortion characteristics will be described. FIG. 22 shows the input-output characteristics of the variable-gain amplifier circuit A1, the variable-gain amplifier circuit A2, and the variable-gain amplifier as a whole. In this figure, line (1)_1 represents the input-output characteristic of the variable-gain amplifier circuit A1 with respect to the fundamental component, line (1)_3 represents the input-output characteristic of the variable-gain amplifier circuit A1 with respect to the third-order harmonic component, line (2)_1 represents the input-output characteristic of the variable-gain amplifier circuit A2 with respect to the fundamental component, line (2)_3 represents the input-output characteristic of the variable-gain amplifier circuit A2 with respect to the third-order harmonic component, line t_1 represents the input-output characteristic of the variable-gain amplifier as a whole with respect to the fundamental component, and line t_3 represents the input-output characteristic of the variable-gain amplifier as a whole with respect to the third-order harmonic component. In the graph of FIG. 22, the input level is taken along the horizontal axis, and the output level is taken along the vertical axis, with both levels given in dB.

The input level that is supposed to cause the fundamental component and the third-order harmonic component to have equal output levels is called the input intercept point (IIP3). The higher this value, the better the intermodulation distortion characteristics obtained. Let the input intercept point in the variable-gain amplifier circuit A1, in the variable-gain amplifier circuit A2, and in the variable-gain amplifier as a whole when the level of the input signal equals p be IIP3_1(p), IIP3_2(p), and IIP3_total(p), respectively. Moreover, let the output level difference between the third-order harmonic component and the fundamental component in the variable-gain amplifier circuit A1, in the variable-gain amplifier circuit A2, and in the variable-gain amplifier as a whole when the level of the input signal equals p be IM3_1(p), IM3_2(p), and IM3_total(p), respectively.

FIG. 22 shows that the gradient of line (1)_1 is 1 and the gradient of line (1)_3 is 3. Hence, $$IIP3\_1(p)=p+IM3\_1(p)/2 \quad (1)$$

Moreover, FIG. 22 shows that the gradient of line t_1 is 1 and the gradient of line t_3 is 3. Hence, $$IIP3\_total(p)=p+\{D+[IM3\_1(p)]\}/2 \quad (2)$$

From equations (1) and (2), IIP3_total(p) is given as $$IIP3\_total(p)=IIP3\_1(p)+D/2 \quad (3)$$

Equation (3) shows that, to increase the input intercept point IIP3 of the variable-gain amplifier as a whole, i.e., to obtain better intermodulation distortion characteristics, the gain difference D needs to be increased. However, as described above, in the variable-gain amplifier of FIG. 19, when high-frequency signals are fed in and their levels are high, it is not possible to obtain a sufficiently large gain difference D. This leads to degraded intermodulation distortion characteristics.

Next, the cause of the second disadvantage, i.e., the voltage drops across output load resistors increasing as more and more variable-gain amplifier circuits are connected in parallel, will be described.

To make the gain characteristic curve of the variable-gain amplifier with respect to the control voltage $V_{AGC}$ smooth, it is advisable to connect a number of (n) variable-gain amplifier circuits in parallel as shown in FIG. 23. In FIG. 23, such circuit elements and signals as are found also in FIG. 19 are identified with the same reference numerals and symbols, and their explanations will not be repeated. The variable-gain amplifier circuits A3 to An are each configured in the same manner as the variable-gain amplifier circuit A1.

In the variable-gain amplifier of FIG. 23, through the output load resistors R5 and R6 flows n times the current that will flow through them in a configuration where only one variable-gain amplifier circuit is provided, causing, accordingly, n times the voltage drops across the output load resistors R5 and R6. Therefore, unless the resistances of the output load resistors are reduced, or the bias current $I_C$ output from the constant current sources is reduced, the transistors provided in the variable-gain amplifier may be saturated and cease to operate. However, since the amplitudes of the output signals equal the resistances of the output load resistors R5 and R6 multiplied by the current of the output signals, which are alternating currents, reducing the resistances of the output load resistors R5 and R6, quite inconveniently, results in reducing the gain of the variable-gain amplifier. On the other hand, reducing the bias current $I_C$ output from the constant current sources, also quite inconveniently, results in narrowing the input dynamic range.

SUMMARY OF THE INVENTION

An object of the present invention is to provide a variable-gain amplifier that offers a wide input dynamic range even when high-frequency signals are fed in.

To achieve the above object, according to one aspect of the present invention, a variable-gain amplifier is provided with a controller for controlling the operation of input transistors. This makes it possible to reduce the leak current that flows through transistors because of their collector-emitter parasitic capacitance when high-frequency signals are fed in and thereby prevent saturation of gain attenuation.

According to another aspect of the present invention, a variable-gain amplifier is provided with a plurality of variable-gain amplifier circuits connected in parallel and a current control circuit for controlling the bias current sources provided within each of the variable-gain amplifier circuits. This makes it possible to reduce the leak current that flows through transistors because of their collector-emitter parasitic capacitance when high-frequency signals are fed in and thereby prevent saturation of gain attenuation.

BRIEF DESCRIPTION OF THE DRAWINGS

This and other objects and features of the present invention will become clear from the following description, taken in conjunction with the preferred embodiments with reference to the accompanying drawings in which:

FIG. 18 is a graph showing the gain characteristic of the variable-gain amplifier of FIG. 16 when high-frequency signals are fed in;

FIG. 21 is a graph showing the gain characteristic of the variable-gain amplifier of FIG. 19 when high-frequency signals are fed in;

DESCRIPTION OF THE PREFERRED EMBODIMENTS

Figure 1:
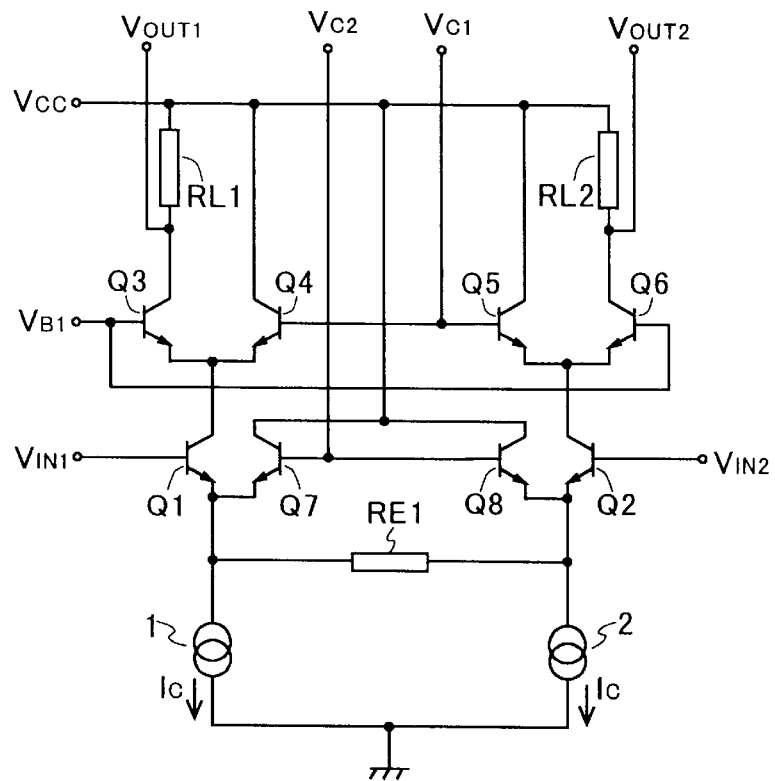
FIG. 1 is a diagram showing the configuration of the variable-gain amplifier of a first embodiment of the invention.
Figure 16:
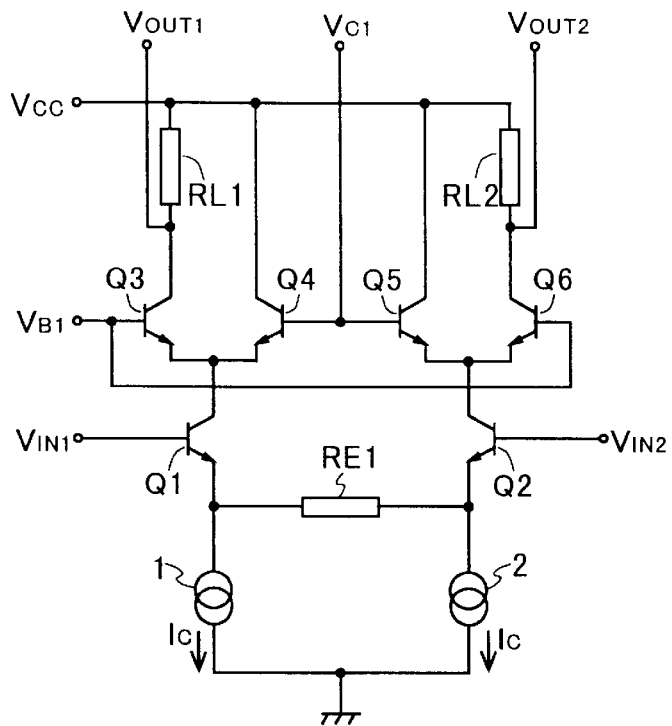
FIG. 16 is a diagram showing an example of the configuration of a conventional variable-gain amplifier.
Figure 17:
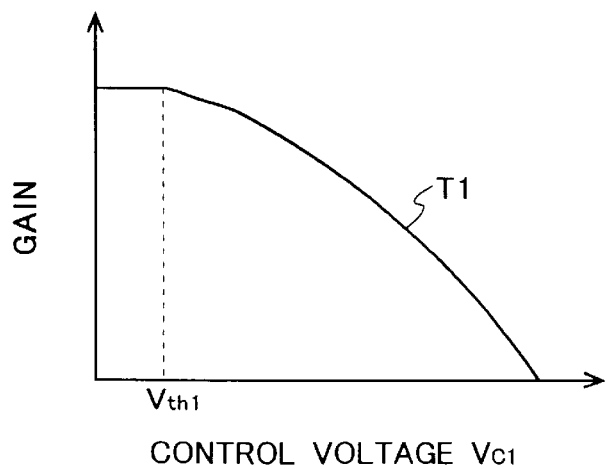
FIG. 17 is a graph showing the gain characteristic of the variable-gain amplifier of FIG. 16.
Figure 18:
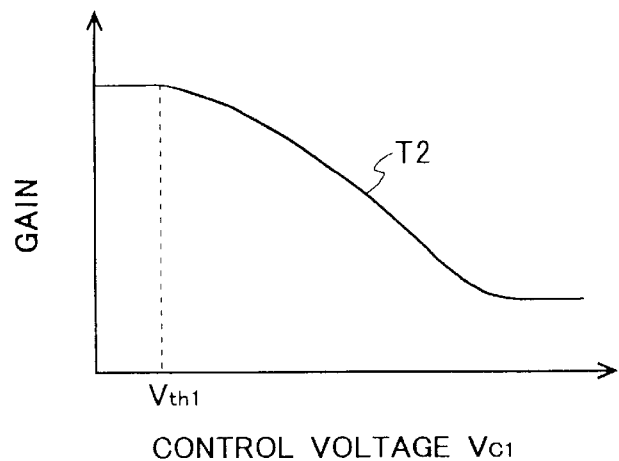

Hereinafter, embodiments of the present invention will be described with reference to the drawings. FIG. 1 shows the configuration of the variable-gain amplifier of a first embodiment of the invention. It is to be noted that such circuit elements and signals as are found also in FIG. 16 are identified with the same reference numerals and symbols, and their explanations will not be repeated. The emitter of an NPN-type transistor Q7 is connected to the emitter of the input transistor Q1, and the emitter of an NPN-type transistor Q8 is connected to the emitter of the input transistor Q2. The collectors of the transistors Q7 and Q8 are connected to the terminal to which the constant voltage $V_{CC}$ is supplied. The bases of the transistors Q7 and Q8 are connected to a terminal to which a subsidiary control voltage $V_{C2}$ is supplied.

Here, for simplicity's sake, it is assumed that the base-emitter voltages of all the transistors are equal, namely $V_{BE}$. It is also assumed that, in setting the subsidiary control voltage $V_{C2}$, no consideration is given to the alternating-current components of the input voltage signals.

The levels of the reference voltage $V_{B1}$ and of the direct-current bias voltage $V_{B2}$ that is included in the input voltage signals $V_{IN1}$ and $V_{IN2}$ are so set as to fulfill formula (4) below.

$$V_{B2} \leq V_{B1} - V_{BE} \quad (4)$$

Hence, let the threshold level of the control voltage $V_{C1}$ at which current starts flowing through the transistors Q4 and Q5 be $V_{th1}$ and the threshold level of the subsidiary control voltage $V_{C2}$ at which current starts flowing through the transistors Q7 and Q8 be $V_{th2}$, then formula (5) below holds.

$$V_{th2} < V_{th1} \quad (5)$$

Therefore, the subsidiary control voltage $V_{C2}$ is so set as to fulfill formula (6) below, where $\alpha > V_{th1} - V_{th2}$. This makes the level of the control voltage $V_{C1}$ at which current starts flowing through the transistors Q7 and Q8 higher than the level of the control voltage $V_{C1}$ at which current starts flowing through the transistors Q4 and Q5.

$$V_{C2} = V_{C1} - \alpha \quad (6)$$

Figure 2:
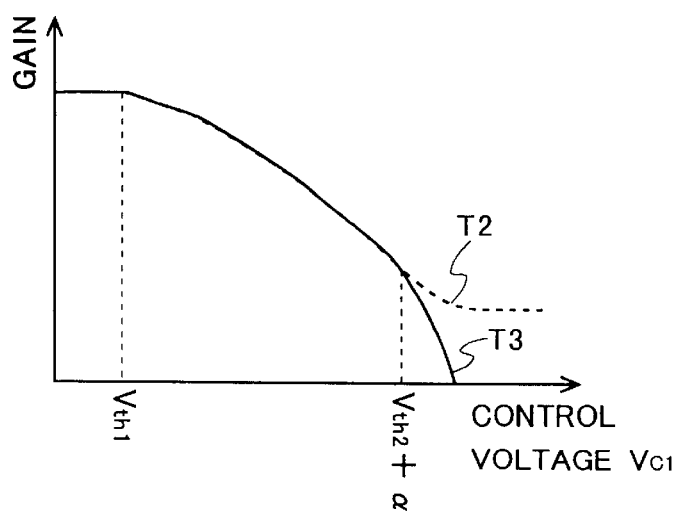
FIG. 2 is a graph showing the gain characteristic of the variable-gain amplifier of FIG. 1.

When the subsidiary control voltage $V_{C2}$ is so set as to fulfill formula (6), the gain characteristic curve T3 with respect to the control voltage $V_{C1}$ when high-frequency signals are fed in is as shown in FIG. 2. It is to be noted that the gain characteristic curve T2 of the variable-gain amplifier of FIG. 16 when high-frequency signals are fed in is shown together.

In the region where $V_{C1} < V_{th1}$, most of the current output from the input transistors flows through transistors Q3 and Q6, and almost no current flows through the transistors Q4 and Q5. In this state, since $V_{C2} < V_{th2}$, almost no current flows through the transistors Q7 and Q8. Thus, in the region where $V_{C1} < V_{th1}$, the variable-gain amplifier offers its maximum gain.

In the region where $V_{th1} < V_{C1} < V_{th2} + \alpha$, the transistors Q4 and Q5 operate, permitting current to flow through them. This current increases as the control voltage $V_{C1}$ increases, and thus the gain decreases as the control voltage $V_{C1}$ increases. In this state, since $V_{C2} < V_{th2}$, almost no current flows through the transistors Q7 and Q8.

Thus, in the region where $V_{C1} < V_{th2} + \alpha$, the gain characteristic curve T3 of the variable-gain amplifier of the first embodiment coincides with the gain characteristic curve T2 of the variable-gain amplifier of FIG. 16.

In the region where $V_{th2} + \alpha < V_{C1}$, the transistors Q3 and Q6 are in an off state, and therefore through them flows only the current that leaks through their parasitic capacitance. Moreover, in this state, since $V_{th2} < V_{C2}$, the transistors Q7 and Q8 operate, permitting current to flow through them. This current increases as the control voltage $V_{C1}$ increases, and thus the current flowing through the input transistors Q1 and Q2 decreases as the control voltage $V_{C1}$ increases. Accordingly, the levels of the signals output at the collectors of the input transistors Q1 and Q2 lower as the control voltage $V_{C1}$ increases. As a result, the levels of the signals that leak through the parasitic capacitance of the transistors Q3 and Q6 decrease as the control voltage $V_{C1}$ increases. In this way, the variable-gain amplifier of the first embodiment achieves sufficient gain attenuation even when high-frequency signals are fed in. Thus, the variable-gain amplifier of the first embodiment offers a wide input dynamic range even when high-frequency signals are fed in.

When the control voltage $V_{C1}$ is made sufficiently high, the transistors Q7 and Q8 are brought into a saturated state. This makes the levels of the signals output at the collectors of the input transistors Q1 and Q2 as small as those of the signals that leak through the parasitic capacitance of the input transistors.

In formula (6) above, the value of $\alpha$ is usually so set that the value of $V_{th2} + \alpha$ is close to the level of the control voltage at which gain attenuation starts to be saturated in a conventional variable-gain amplifier when high-frequency signals are fed in (see FIG. 2). However, the value of α may be set to be smaller than the value so determined.

Figure 3:
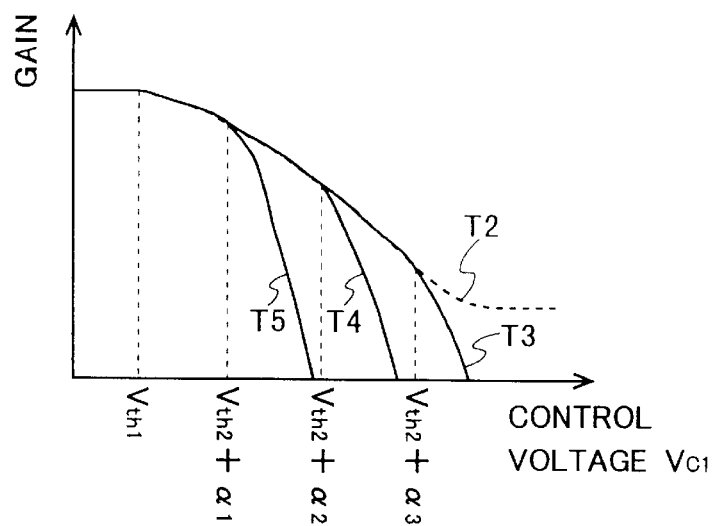
FIG. 3 is a graph showing the gain characteristic of the variable-gain amplifier of FIG. 1, with different settings of the subsidiary control voltage.

FIG. 3 shows the gain characteristic with respect to the control voltage $V_{C1}$, with different values of α. The gain characteristic curves T5, T4, and T3 represent the gain characteristic curves observed when α=α$_1$, α=α$_2$, and α=α$_3$, respectively. Here, α$_1$<α$_2$<α$_3$, and it is assumed that, when α=α$_3$, the value of $V_{th2}$+α is close to the level of the control voltage at which gain attenuation starts to be saturated. As will be clear from FIG. 3, the smaller the value of α, the higher the gain at which gain attenuation is started and the more steeply it is effected by the operation of the transistors Q7 and Q8. That is, by making the value of a smaller, it is possible to heighten the gain at which the rate of gain attenuation with respect to the control voltage $V_{C1}$ is switched, and also to increase the rate of gain attenuation with respect to the control voltage $V_{C1}$ after the switching.

Figure 4:
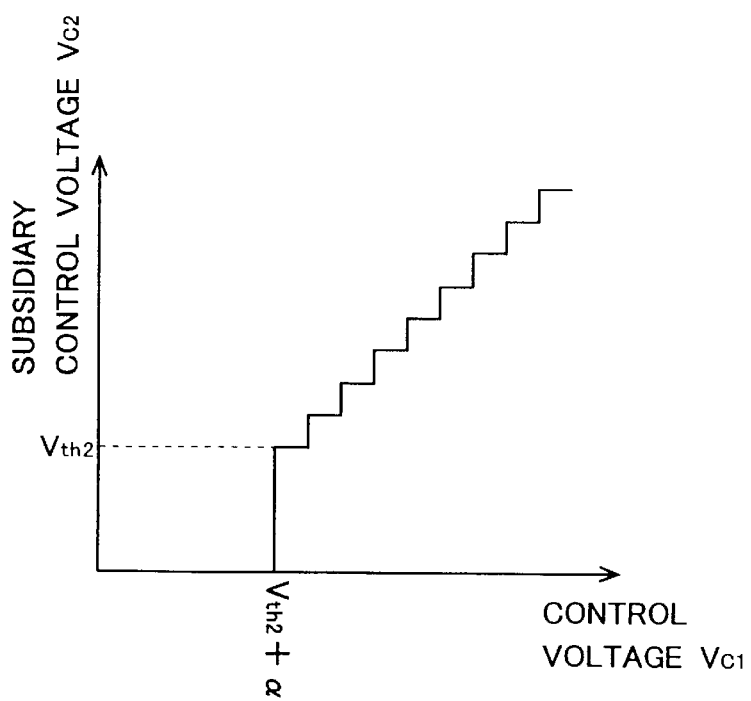
FIG. 4 is a graph showing the relationship between the control voltage and the subsidiary control voltage as observed when the subsidiary control voltage is varied stepwise.
Figure 5:
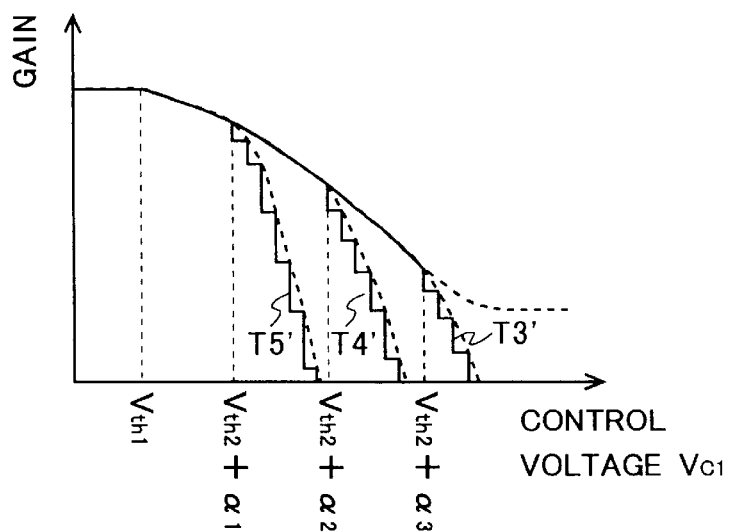
FIG. 5 is a graph showing the gain characteristic of the variable-gain amplifier of FIG. 1 as observed when the subsidiary control voltage is varied stepwise, with different settings of the subsidiary control voltage.

In the embodiment described above, the subsidiary control voltage $V_{C2}$ is varied continuously according to the control voltage $V_{C1}$ so as to fulfill the relationship of formula (6). However, it is also possible, as shown in FIG. 4, to vary the subsidiary control voltage $V_{C2}$ stepwise according to the control voltage $V_{C1}$ in the region where $V_{th2}$+α<$V_{C1}$. Using the subsidiary control voltage $V_{C2}$ varying stepwise in this way permits the transistors Q7 and Q8 to be controlled stepwise. In this case, the gain characteristic with respect to the control voltage $V_{C1}$ is as shown in FIG. 5.

This also makes it possible to achieve sufficient gain attenuation even when high-frequency signals are fed in, just as in a case where the subsidiary control voltage $V_{C2}$ is varied continuously according to the control voltage $V_{C1}$ so as to fulfill the relationship of formula (6). Moreover, by making the value of α smaller, it is possible to heighten the gain at which the rate of gain attenuation with respect to the control voltage $V_{C1}$ is switched, and also to increase the rate of gain attenuation with respect to the control voltage $V_{C1}$ after the switching.

In addition, since the subsidiary control voltage $V_{C2}$ does not need to be varied continuously with respect to the control voltage $V_{C1}$ so as to fulfill the relationship of formula (6), it is easy to produce the subsidiary control voltage $V_{C2}$. Moreover, in the region where $V_{C1}$<$V_{th2}$+α, it is possible to reduce the subsidiary control voltage $V_{C2}$ to zero. It is to be noted that, in the region where $V_{th2}$+α<$V_{C1}$, the smaller the step width of the control voltage $V_{C1}$ is made, the smoother the gain characteristic curve obtained, i.e., the closer to that shown in FIG. 3.

Figure 6:
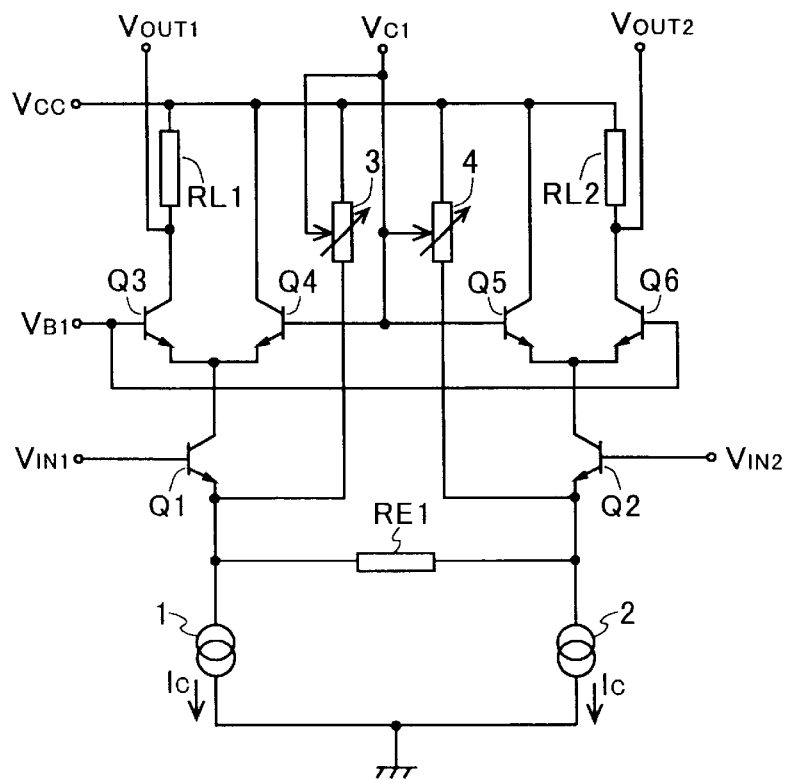
FIG. 6 is a diagram showing the configuration of the variable-gain amplifier of a second embodiment of the invention.

Next, the variable-gain amplifier of a second embodiment of the invention will be described. FIG. 6 shows the configuration of the variable-gain amplifier of the second embodiment. It is to be noted that such circuit elements and signals as are found also in FIG. 16 are identified with the same reference numerals and symbols, and their explanations will not be repeated.

One end of a variable resistor 3 and one end of a variable resistor 4 are connected to the terminal to which the constant voltage $V_{CC}$ is supplied. The other end of the variable resistor 3 is connected to the emitter of the input transistor Q1, and the other end of the variable resistor 4 is connected to the emitter of the input transistor Q2.

Figure 7:
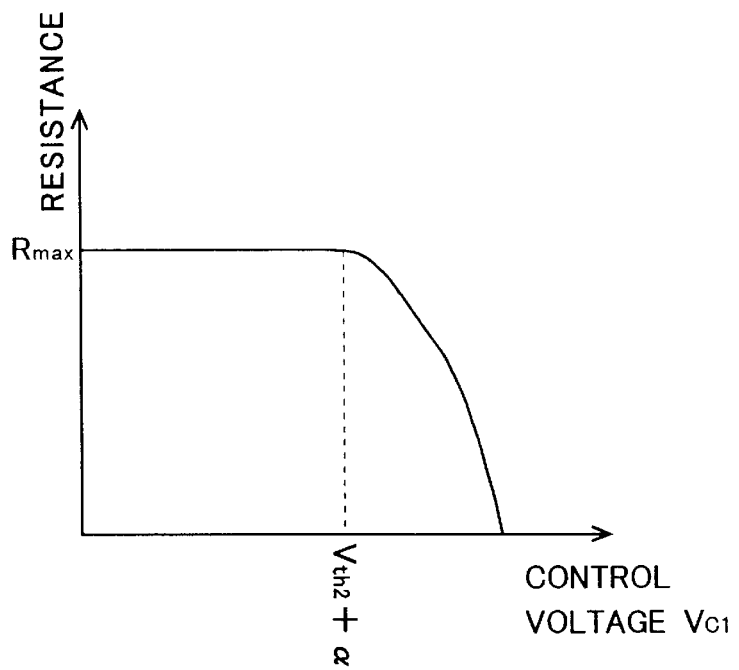
FIG. 7 is a graph showing the resistance characteristic of the variable resistor provided in the variable-gain amplifier of FIG. 6.

The resistances of the variable resistors 3 and 4 are controlled by the control voltage $V_{C1}$. FIG. 7 shows the resistance characteristic of the variable resistors 3 and 4 with respect to the control voltage $V_{C1}$. Here, the variable resistors 3 and 4 are assumed to have identical resistance characteristics. The maximum resistance $R_{max}$ of the variable resistors 3 and 4 is so set as to fulfill the relationship represented by formula (7) below, where $I_p(R_{max})$ represents the current that flows through the variable resistors 3 and 4 when their resistances equal $R_{max}$.

$$V_{CC} - R_{max} \times I_p(R_{max}) << V_{B2} - V_{BE} \quad (7)$$

By setting the maximum resistance $R_{max}$ of the variable resistors 3 and 4 so as to fulfill the relationship of formula (7), it is possible to prevent the emitter potentials of the input transistors Q1 and Q2 from becoming higher than $V_{B2}-V_{BE}$ when the control voltage $V_{C1}$ is low. Thus, even when the control voltage $V_{C1}$ is low, the current flowing through the input transistors Q1 and Q2 does not diminish in the region where $V_{C1}$<$V_{th2}$+α.

On the other hand, in the region where $V_{th2}$+α<$V_{C1}$, the resistances of the variable resistors 3 and 4 decrease steeply as the control voltage $V_{C1}$ increases, and thus the current flowing through the variable resistors 3 and 4 increases steeply as the control voltage $V_{C1}$ increases. As a result, the current flowing through the input transistors Q1 and Q2 decreases as the control voltage $V_{C1}$ increases, and the levels of the signals output at the collectors of the input transistors Q1 and Q2 lower as the control voltage $V_{C1}$ increases. Thus, the levels of the signals that leak through the parasitic capacitance of the transistors Q3 and Q6 decrease as the control voltage $V_{C1}$ increases.

In this way, the variable-gain amplifier of the second embodiment exhibits the identical gain characteristic to that of the variable-gain amplifier of the first embodiment. That is, the variable-gain amplifier of the second embodiment achieves sufficient gain attenuation even when high-frequency signals are fed in. Thus, the variable-gain amplifier of the second embodiment offers a wide input dynamic range even when high-frequency signals are fed in.

Figure 8:
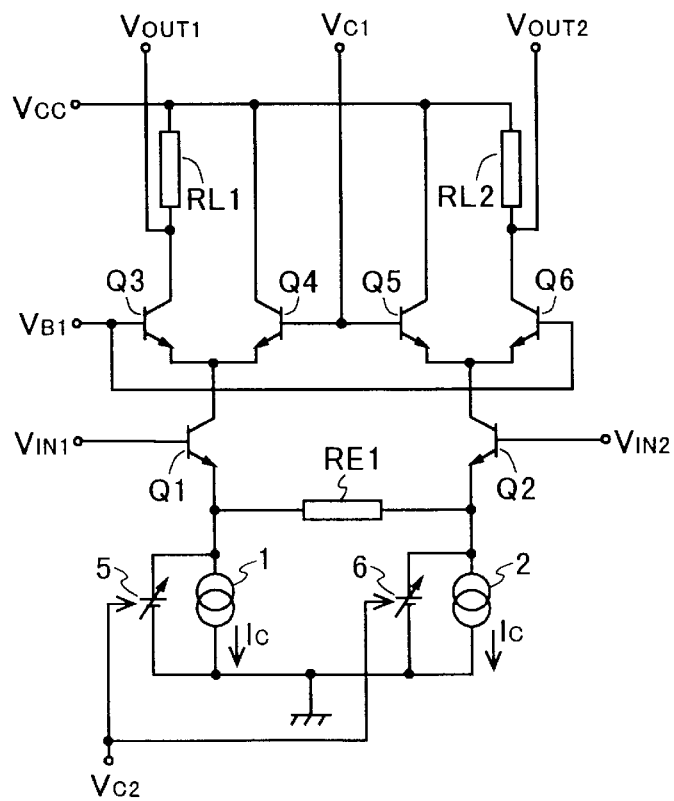
FIG. 8 is a diagram showing the configuration of the variable-gain amplifier of a third embodiment of the invention.

Next, the variable-gain amplifier of a third embodiment of the invention will be described. FIG. 8 shows the configuration of the variable-gain amplifier of the third embodiment. It is to be noted that such circuit elements and signals as are found also in FIG. 16 are identified with the same reference numerals and symbols, and their explanations will not be repeated.

A variable voltage source 5 has its positive side connected to the emitter of the input transistor Q1, and has its negative side grounded. A variable voltage source 6 has its positive side connected to the emitter of the input transistor Q2, and has its negative side grounded.

The output voltages of the variable voltage sources 5 and 6 are controlled by a subsidiary control voltage $V_{C2}$. Moreover, it is assumed that, between the subsidiary control voltage $V_{C2}$ and the control voltage $V_{C1}$, the relationship represented by formula (6) noted earlier holds. Here, however, as distinct from the variable-gain amplifier of the first embodiment, $V_{th2}$ in formula (6) represents the threshold level of the subsidiary control voltage $V_{C2}$ at which current starts flowing from the variable voltage sources 5 and 6.

Figure 9:
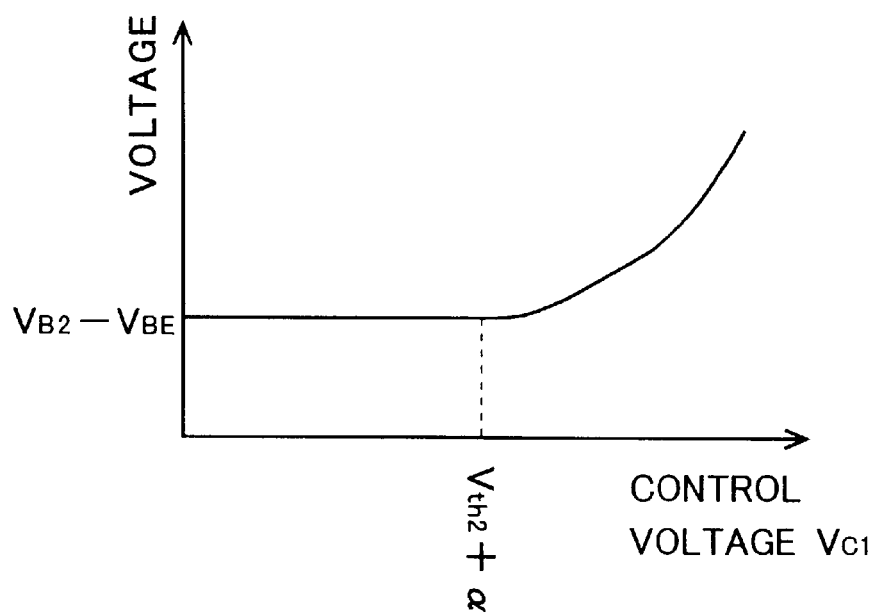
FIG. 9 is a graph showing the output voltage characteristic of the variable voltage source provided in the variable-gain amplifier of FIG. 8.

FIG. 9 shows the output voltage characteristic of the variable voltage sources 5 and 6 with respect to the control voltage $V_{C1}$. Here, the variable voltage sources 5 and 6 are assumed to have identical output voltage characteristics.

In the region where $V_{C1}$<$V_{th2}$+α, the output voltages of the variable voltage sources 5 and 6 equal $V_{B2}-V_{BE}$, and the emitter potentials of the input transistors remain equal to $V_{B2}-V_{BE}$. Thus, the current flowing through the input transistors Q1 and Q2 does not decrease, and therefore no current flows out of the variable voltage sources 5 and 6.

On the other hand, in the region where $V_{th2}+\alpha<V_{C1}$, the output voltages of the variable voltage sources 5 and 6 increase steeply, and the emitter potentials of the input transistors increase accordingly. As a result, the current flowing through the input transistors Q1 and Q2 decreases as the control voltage $V_{C1}$ increases, and, to compensate for the decrease, current flows out of the variable voltage sources 5 and 6. Thus, the levels of the signals output at the collectors of the input transistors Q1 and Q2 decrease as the control voltage $V_{C1}$ increases, and accordingly the levels of the signals that leak through the parasitic capacitance of the transistors Q3 and Q6 lower as the control voltage $V_{C1}$ increases.

In this way, the variable-gain amplifier of the third embodiment exhibits the identical gain characteristic to that of the variable-gain amplifier of the first embodiment. That is, the variable-gain amplifier of the third embodiment achieves sufficient gain attenuation even when high-frequency signals are fed in. Thus, the variable-gain amplifier of the third embodiment offers a wide input dynamic range even when high-frequency signals are fed in.

In the embodiments described thus far, in setting the subsidiary control voltage $V_{C2}$, no consideration is given to the alternating-current components included in the input voltage signals $V_{IN1}$ and $V_{IN2}$. In practice, however, for example in a case where the input voltage signal $V_{IN1}$ is a signal having a direct-current bias voltage added to an alternating-current component and the input voltage signal $V_{IN2}$ is a signal including only a direct-current bias voltage, it is advisable to feed the transistor Q7, variable resistor 3, or variable voltage source 5 with a subsidiary control voltage $V_{C2}'$ obtained by compensating the subsidiary control voltage $V_{C2}$ for the alternating-current component of the input voltage signal $V_{IN1}$ and feed the transistor Q8, variable resistor 4, or variable voltage source 6 with the subsidiary control voltage $V_{C2}$.

In the variable-gain amplifiers of the first to third embodiments described above, the two input transistors have their emitters connected together through a resistor. However, the present invention may be implemented with any other configuration. For example, it is also possible, in a variable-gain amplifier in which the emitters of two input transistors are both connected to a single constant current source, to provide a variable voltage source that supplies a voltage to the node at which the emitters of the input transistors are connected together. Providing a variable voltage source like this makes it possible to control the emitter potentials of the input transistors. This permits the collector current of the input transistors to be reduced, and thus makes it possible to achieve sufficient gain attenuation even when high-frequency signals are fed in.

Figure 10:
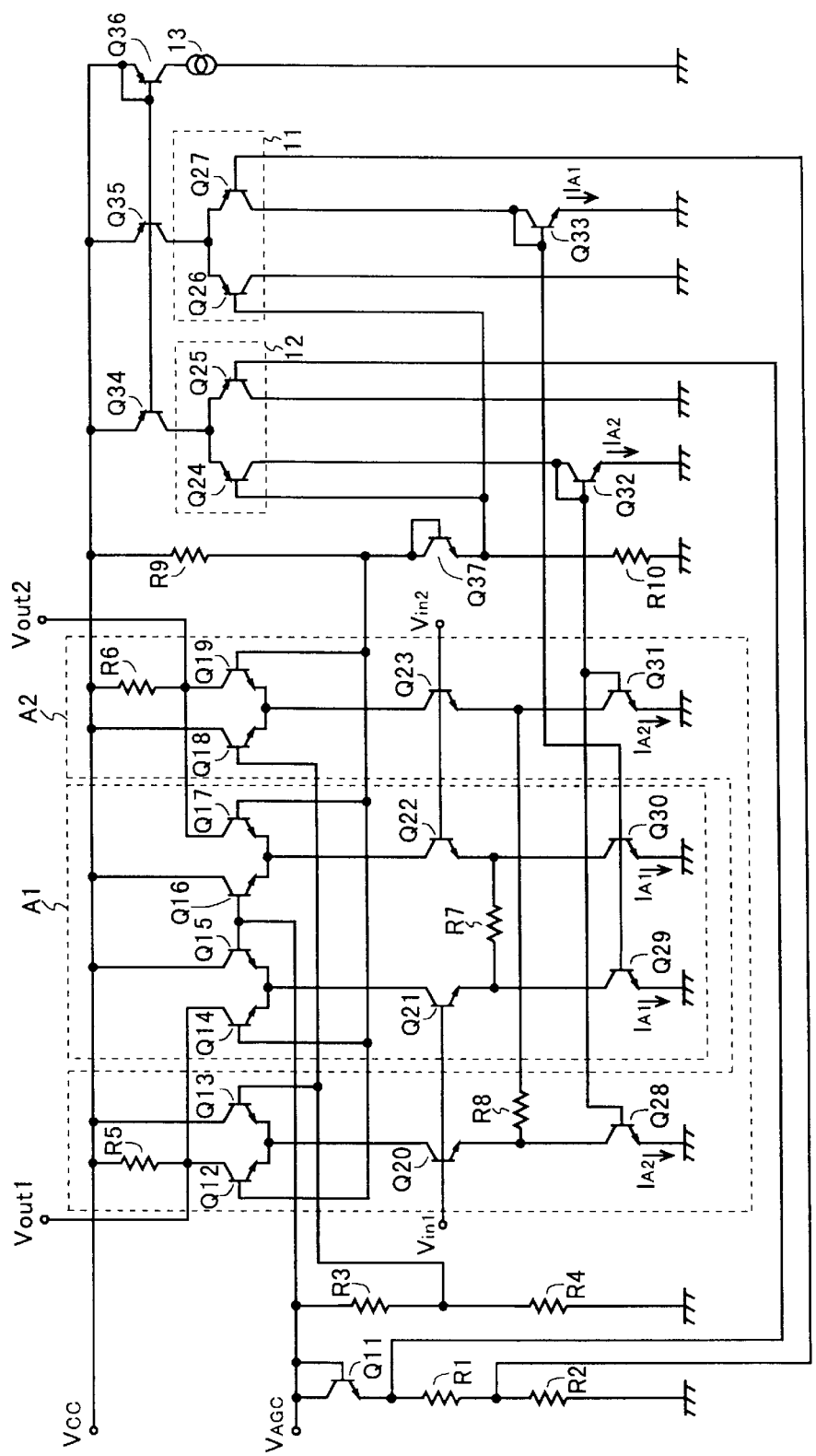
FIG. 10 is a diagram showing the configuration of the variable-gain amplifier of a fourth embodiment of the invention.
Figure 19:
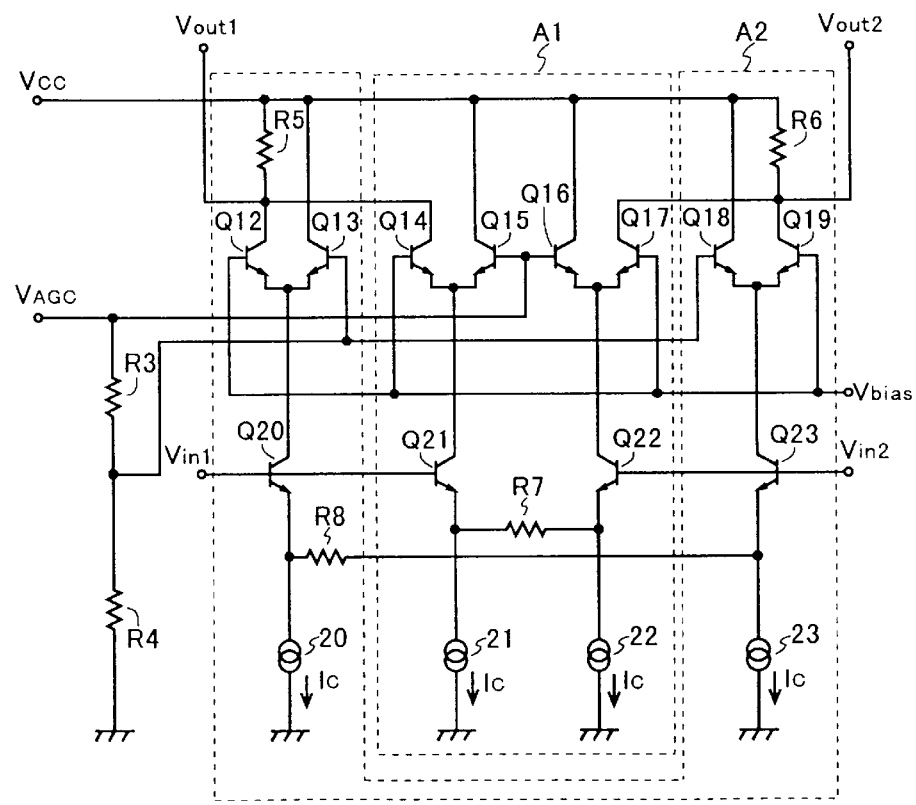
FIG. 19 is a diagram showing another example of the configuration of a conventional variable-gain amplifier.
Figure 20:
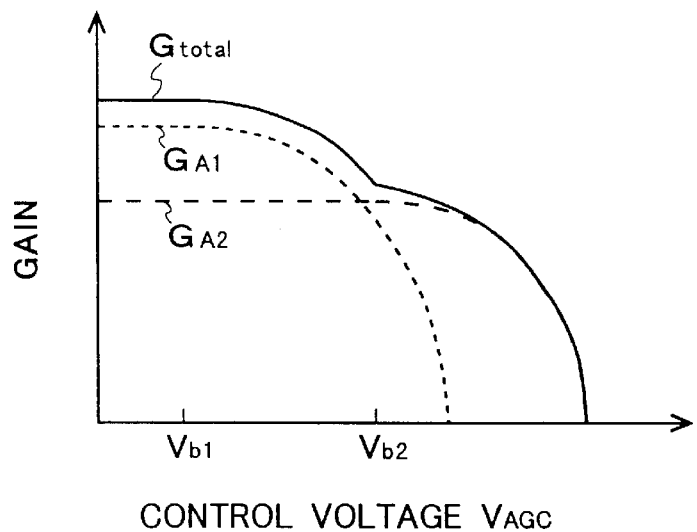
FIG. 20 is a graph showing the gain characteristic of the variable-gain amplifier of FIG. 19.
Figure 21:
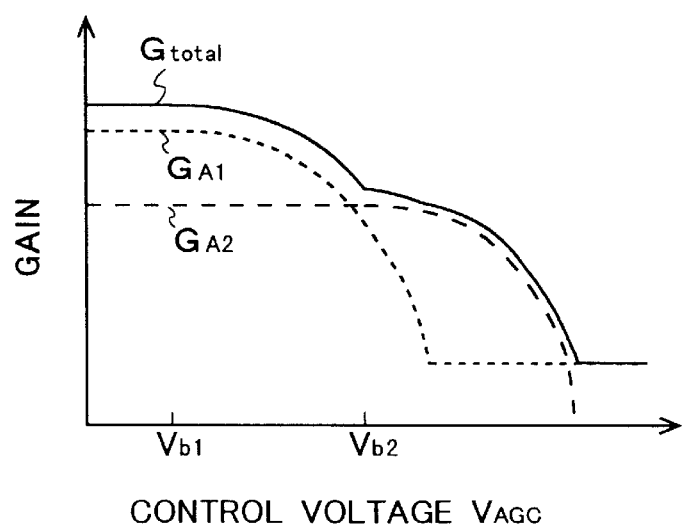
Figure 22:
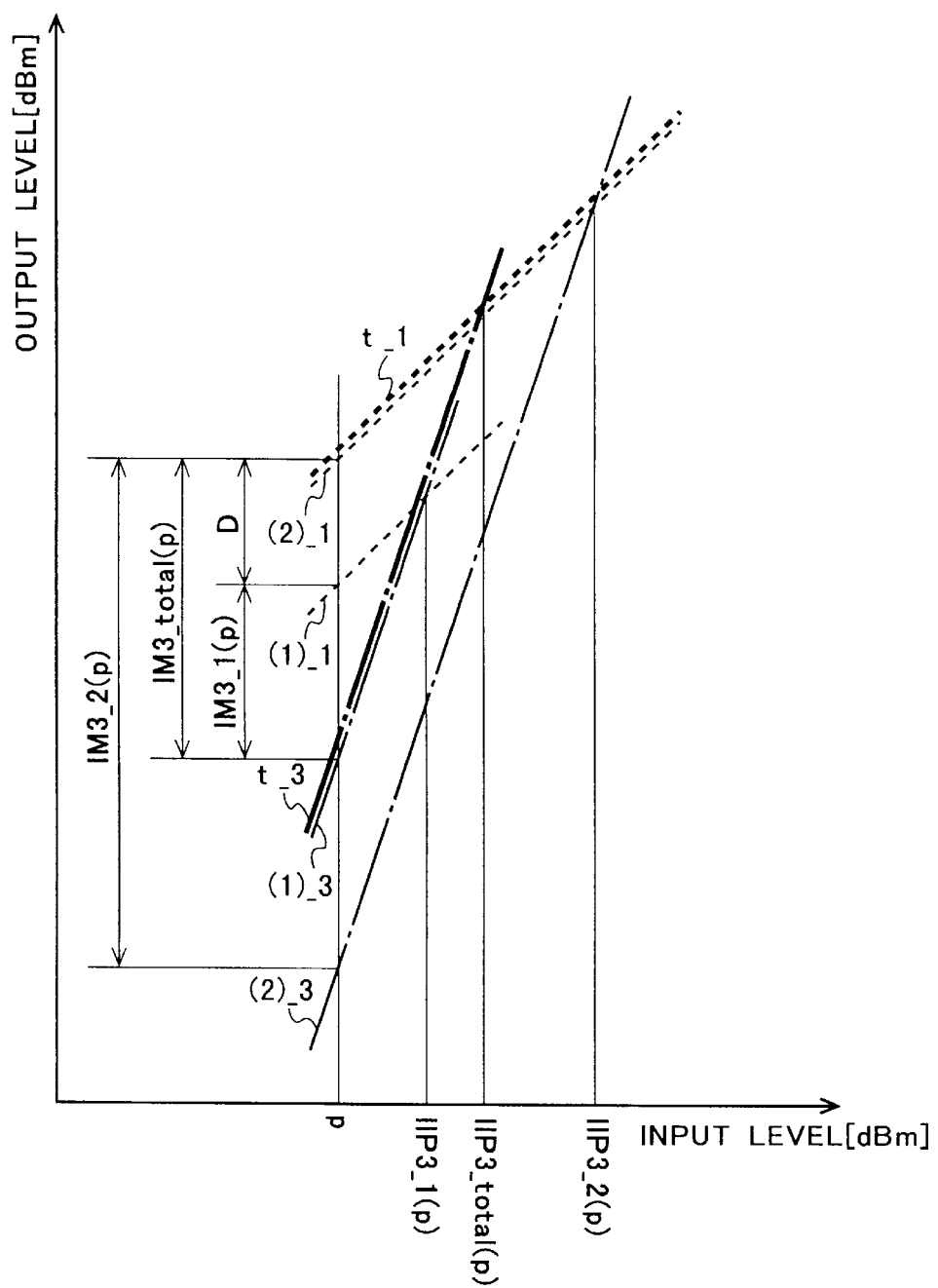
FIG. 22 is a graph showing the input-output characteristic of the variable-gain amplifier of FIG. 19.
Figure 23:
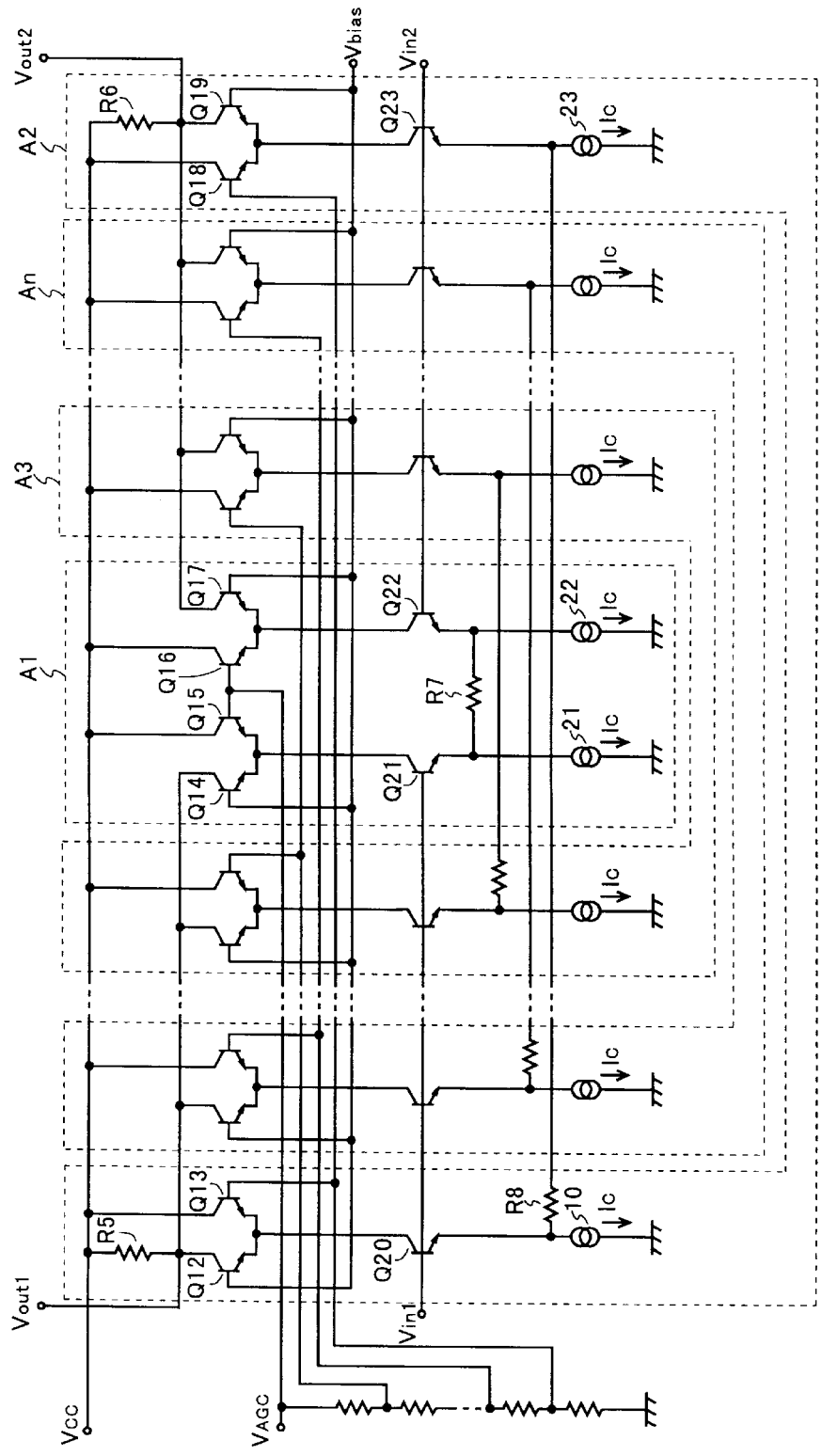
FIG. 23 is a diagram showing still another example of the configuration of a conventional variable-gain amplifier.

Next, the variable-gain amplifier of a fourth embodiment of the invention will be described. FIG. 10 shows the configuration of the variable-gain amplifier of the fourth embodiment. It is to be noted that such circuit elements and signals as are found also in FIG. 19 are identified with the same reference numerals and symbols, and their explanations will not be repeated.

In the variable-gain amplifier of FIG. 10, the current sources provided in the variable-gain amplifier circuit A1 are realized with a current mirror circuit that is composed of transistors Q29, Q30, and Q33 and that outputs a bias current $I_{A1}$. That is, the constant current sources 21 and 22 in FIG. 19 are replaced with an NPN-type transistor Q29 having its collector connected to the emitter of the transistor Q21, an NPN-type transistor Q30 having its collector connected to the emitter of the transistor Q22, and an NPN-type transistor Q33 having its base and collector connected to the bases of the transistors Q29 and Q30. The emitters of the transistors Q29, Q30, and Q33 are grounded.

Moreover, the variable-gain amplifier of FIG. 10 is provided with a differential amplifier circuit 11 that controls the collector current of the transistor Q33. The differential amplifier circuit 11 is composed of a PNP-type transistor Q26 and a PNP-type transistor Q27. The emitters of the transistors Q26 and Q27 are connected together, and are connected to the collector of a PNP-type transistor Q35. The collector of the transistor Q26 is grounded, and the collector of the transistor Q27 is connected to the collector and base of the transistor Q33.

Furthermore, in the variable-gain amplifier of FIG. 10, the current sources provided in the variable-gain amplifier circuit A2 are realized with a current mirror circuit that is composed of transistors Q28, Q31, and Q32 and that outputs a bias current $I_{A2}$. That is, the constant current sources 20 and 23 in FIG. 19 are replaced with an NPN-type transistor Q28 having its collector connected to the emitter of the transistor Q20, an NPN-type transistor Q31 having its collector connected to the emitter of the transistor Q23, and an NPN-type transistor Q32 having its base and collector connected to the bases of the transistors Q28 and Q31. The emitters of the transistors Q28, Q31, and Q32 are grounded.

Moreover, the variable-gain amplifier of FIG. 10 is provided with a differential amplifier circuit 12 that controls the collector current of the transistor Q32. The differential amplifier circuit 12 is composed of a PNP-type transistor Q24 and a PNP-type transistor Q25. The emitters of the transistors Q24 and Q25 are connected together, and are connected to the collector of a PNP-type transistor Q34. The collector of the transistor Q25 is grounded, and the collector of the transistor Q24 is connected to the collector and base of the transistor Q32.

Furthermore, the variable-gain amplifier of FIG. 10 is provided with a current mirror circuit that supplies constant currents to the differential amplifier circuits 11 and 12. This current mirror circuit is composed of transistors Q34, Q35, and Q36. The bases and collectors of all the transistors Q34, Q35, and Q36 are connected to the terminal to which the constant voltage $V_{CC}$ is supplied. The collector of the transistor Q36 is grounded through constant current source 13.

The bases of the transistors Q24 and Q26 are connected to the emitter of an NPN-type transistor Q37. The emitter of the transistor Q37 is grounded through a resistor R10. The base and collector of the transistor Q37 are connected together, and are connected to the bases of the transistors Q12, Q14, Q17, and Q19 and also through a resistor R9 to the terminal to which the constant voltage $V_{CC}$ is supplied.

The base of the transistor Q25 is connected to one end of a resistor R1, and the base of the transistor Q27 is connected to the other end of the resistor R1. Also connected to the first end of the resistor R1 is the emitter of an NPN-type transistor Q11, and the other end of the resistor R1 is grounded through a resistor R2. The base and collector of the transistor Q11 are connected together, and are connected to the terminal to which the control voltage $V_{AGC}$ is supplied.

Figure 11A:
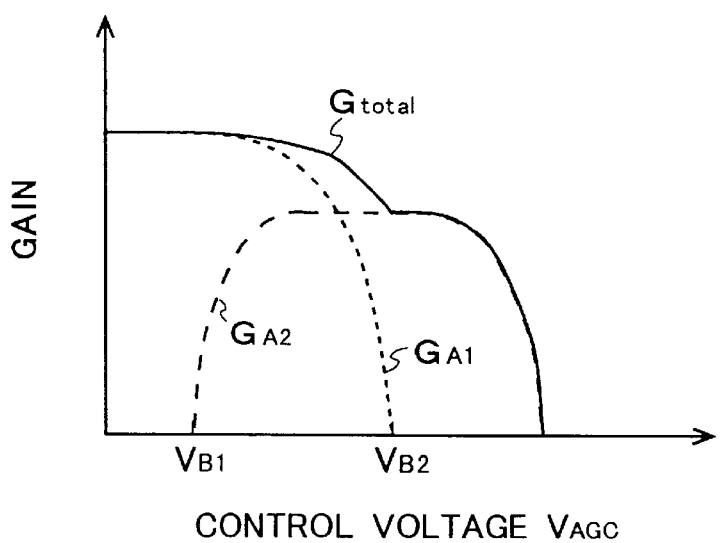
FIG. 11A is a diagram showing the gain characteristic of the variable-gain amplifier of FIG. 10.
Figure 11B:
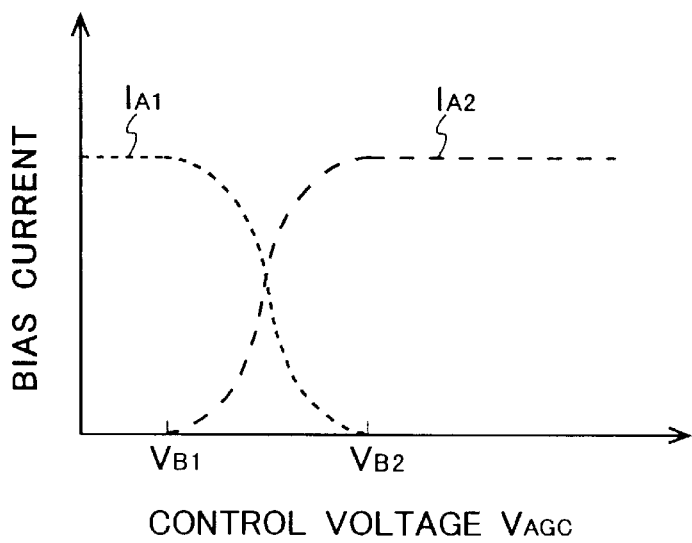
FIG. 11B is a diagram showing the bias current characteristic of each variable-gain amplifier circuit provided in the variable-gain amplifier of FIG. 10.

Next, the operation of the variable-gain amplifier of FIG. 10 configured as described above will be described. Let the base potential of the transistors Q12, Q14, Q17, and Q19 be $V_{bias1}$, and the base potential of the transistors Q24 and Q26 be $V_{bias2}$. Between $V_{bias1}$ and $V_{bias2}$, there is a potential difference equal to the base-emitter voltage of the transistor Q37. On the other hand, between the base potential of the transistors Q15 and Q16 and the base potential of the transistor Q25, there is a potential difference equal to the base-emitter voltage of the transistor Q11. Thus, if the resistances of the resistors R1 and R3 are equal, and the resistances of the resistors R2 and R4 are equal, the threshold level of the control voltage $V_{AGC}$ at which the differential amplifier circuit composed of the transistors Q14 and Q15 and the differential amplifier circuit composed of the transistors Q16 and Q17 start gain attenuation is equal to the threshold level of the control voltage $V_{AGC}$ at which the differential amplifier circuit 12 makes bias currents start flowing in the variable-gain amplifier circuit A2. Moreover, the threshold level of the control voltage $V_{AGC}$ at which the differential amplifier circuit composed of the transistors Q12 and Q13 and the differential amplifier circuit composed of the transistors Q18 and Q19 start gain attenuation is equal to the threshold level of the control voltage $V_{AGC}$ at which the differential amplifier circuit 11 makes bias currents almost stop flowing in the variable-gain amplifier circuit A1. Specifically, the gain characteristic and bias current characteristic with respect to the control voltage $V_{AGC}$ are as shown in FIGS. 11A and 11B, respectively.

When $V_{AGC} < V_{B1}$, the base potentials of the transistors Q13, Q15, Q16, and Q18 are lower than $V_{bias1}$, and therefore neither of the variable-gain amplifier circuits A1 and A2 perform gain attenuation. Thus, the variable-gain amplifier offers a high gain. Moreover, when $V_{AGC} < V_{B1}$, if only the base potentials of the transistors Q12 to Q19 are considered, both the variable-gain amplifier circuits A1 and A2 can be said to be operating, but, in reality, almost no bias current $I_{A2}$ flows, and therefore only the variable-gain amplifier circuit A1 is operating effectively, offering good noise figure characteristics.

When $V_{B1} < V_{AGC}$, as the control voltage $V_{AGC}$ increases, the gain $G_{A1}$ of the variable-gain amplifier circuit A1 is attenuated, and the bias current $I_{A1}$ decreases. Thus, the operation of the variable-gain amplifier circuit A1 heads for a halt. Simultaneously, the bias current $I_{A2}$ increases, and thus the current flowing through the transistors Q28 and Q31 increases, making the variable-gain amplifier circuit A2 start operating. When the control voltage $V_{AGC}$ further increases until $V_{B2} < V_{AGC}$, almost no bias current $I_{A1}$ flows. Thus, the variable-gain amplifier circuit A1 stops operating, and now only the variable-gain amplifier circuit A2 is operating. In this state, the variable-gain amplifier circuit A1 does not affect the $G_{total}$ of the variable-gain amplifier, offering good intermodulation distortion characteristics.

Moreover, since only the variable gain amplifier circuit that is currently operating draws current through the output load resistors R5 and R6, the voltage drops across the output load resistors R5 and R6 do not become unduly large. This prevents the transistors provided within the variable-gain amplifier from being saturated and ceasing to operate. Moreover, the bias currents $I_{A1}$ and $I_{A2}$ are not constant but are varied according to the control voltage $V_{AGC}$ so as to be smaller than the bias current $I_C$ in a conventional variable-gain amplifier. Thus, it is possible to reduce power consumption compared with the variable-gain amplifier of FIG. 19. Moreover, there is secured a range of the control voltage $V_{AGC}$ ($V_{B1} < V_{AGC} < V_{B2}$) in which, when the variable-gain amplifier circuits are switched from one to the other, the variable-gain amplifier circuit that is going to stop being operated and the variable-gain amplifier circuit that is going to start being operated both operate concurrently. This prevents the gain of the variable-gain amplifier from lowering when which variable-gain amplifier to operate is switched.

Figure 12:
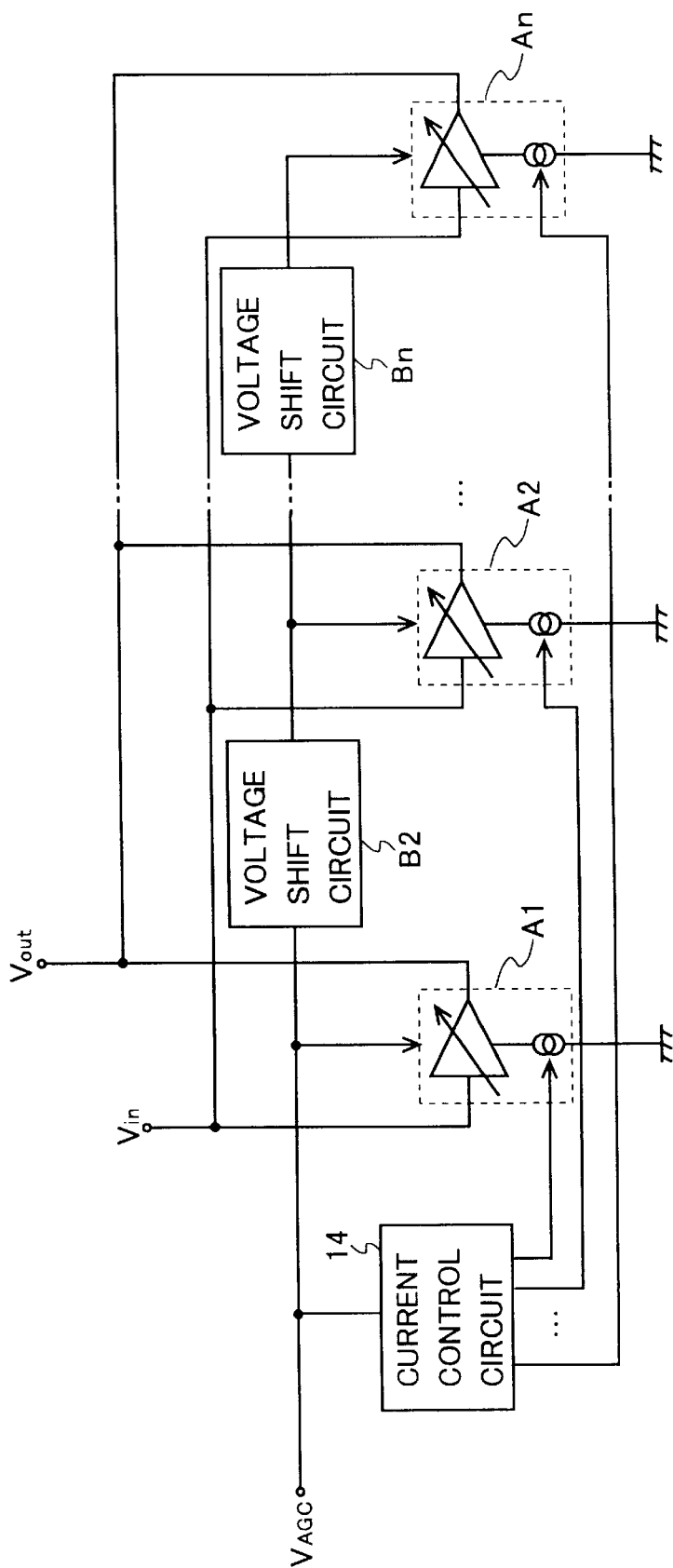
FIG. 12 is a diagram showing the configuration of the variable-gain amplifier of FIG. 10 when it is provided with a number of variable-gain amplifier circuits.

In the variable-gain amplifier of FIG. 10 described above, for simplicity's sake, two variable-gain amplifier circuits A1 and A2 are connected in parallel. In practice, however, to make the gain characteristic of the variable-gain amplifier with respect to the control voltage $V_{AGC}$ smooth, it is preferable to connect more variable-gain amplifier circuits in parallel. FIG. 12 shows a variable-gain amplifier according to the invention in which a number of variable-gain amplifier circuits are connected in parallel. It is to be noted that such circuit elements and signals as are found also in FIG. 10 are identified with the same reference numerals and symbols, and their explanations will not be repeated.

The variable-gain amplifier of FIG. 12 is provided with a variable-gain amplifier circuit A1, a variable-gain amplifier circuit A2, variable-gain amplifier circuits A3 to An each configured in the same manner as the variable-gain amplifier circuit A1, voltage shift circuits B2 to Bn that supply the variable-gain amplifier circuits A2 to An individually with control voltages, and a current control circuit 14 that controls the bias currents for the variable-gain amplifier circuits A1 to An individually. The variable-gain amplifier circuits A1 to An are connected in parallel. As described above, according to the present invention, only the variable-gain amplifier circuit that is currently operating draws current through the output load resistors, and thus the voltage drops across the output load resistors are small. This makes the present invention especially useful in variable-gain amplifiers having a number of variable-gain amplifier circuits connected in parallel.

Figure 13:
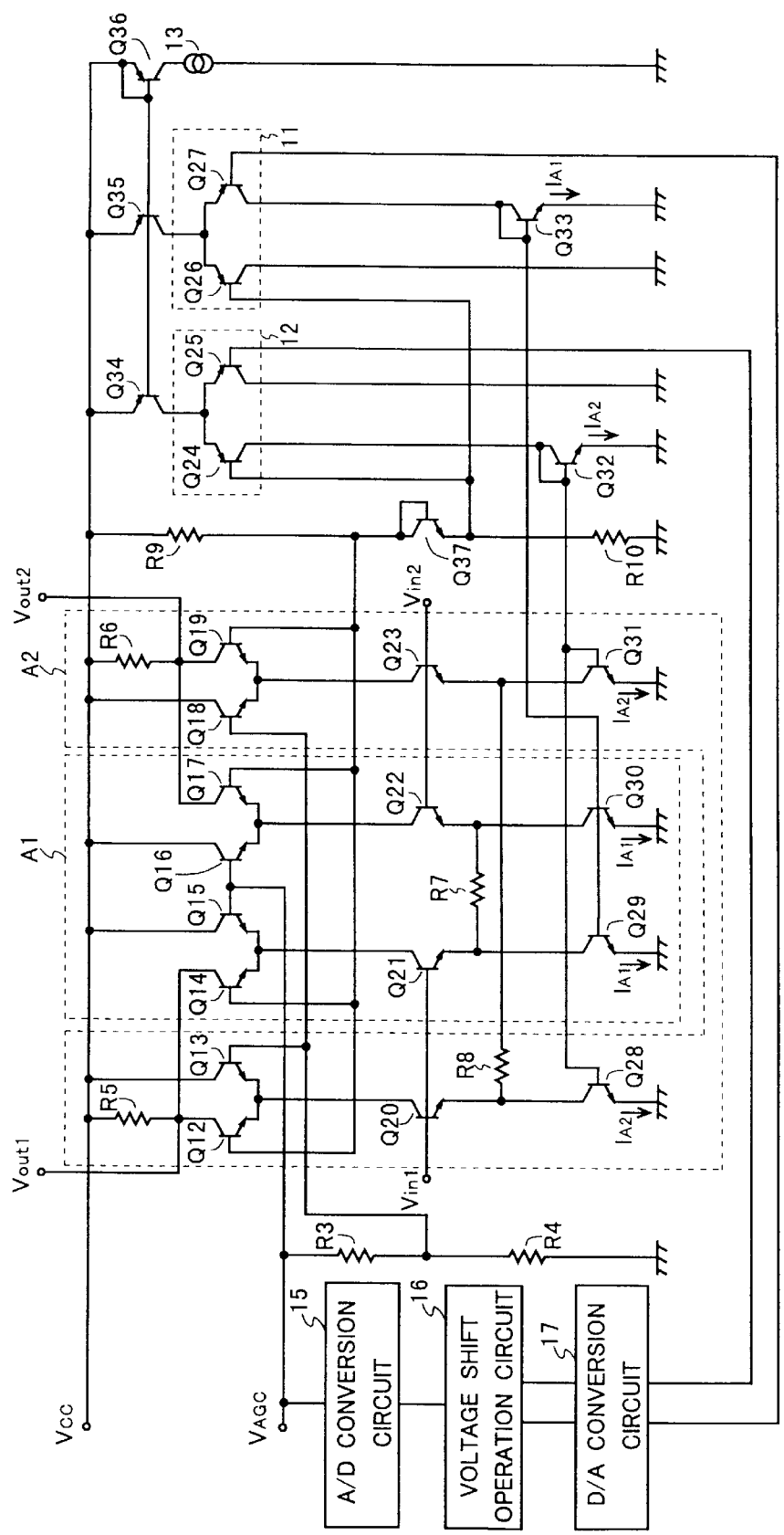
FIG. 13 is a diagram showing the configuration of the variable-gain amplifier of a fifth embodiment of the invention.

Next, the variable-gain amplifier of a fifth embodiment of the invention will be described. FIG. 13 shows the configuration of the variable-gain amplifier of the fifth embodiment. It is to be noted that such circuit elements and signals as are found also in FIG. 10 are identified with the same reference numerals and symbols, and their explanations will not be repeated.

An A/D conversion circuit 15 converts the control voltage $V_{AGC}$ as represented by an analog value into a voltage as represented by a digital value, and outputs the result to a voltage shift operation circuit 16. The voltage shift operation circuit 16 shifts, by different predetermined values, the voltage as represented by the digital value output from the A/D conversion circuit 15 so as to output different voltages $V_{D1}$ and $V_{D2}$ as represented by digital values to a D/A conversion circuit 17. The D/A conversion circuit 17 converts the voltages $V_{D1}$ and $V_{D2}$ as represented by the digital values into voltages $V_{A1}$ and $V_{A2}$ as represented by analog values, respectively, and outputs the voltage $V_{A1}$ to the base of the transistor Q27 and the voltage $V_{A2}$ to the base of the transistor Q25.

Here, the predetermined values by which the voltage shift operation circuit 16 shifts the voltage fed to it to calculate the voltages $V_{D1}$ and $V_{D2}$ as represented by digital values are so set that the threshold level of the control voltage $V_{AGC}$ at which the differential amplifier circuit composed of the transistors Q14 and Q15 and the differential amplifier circuit composed of the transistors Q16 and Q17 start gain attenuation is equal to the threshold level of the control voltage $V_{AGC}$ at which the differential amplifier circuit 12 makes the bias current $I_{A2}$ start flowing in the variable-gain amplifier circuit A2, and that the threshold level of the control voltage $V_{AGC}$ at which the differential amplifier circuit composed of the transistors Q12 and Q13 and the differential amplifier circuit composed of the transistors Q18 and Q19 start gain attenuation is equal to the threshold level of the control voltage $V_{AGC}$ at which the differential amplifier circuit 11 makes the bias current $I_{A1}$ almost stop flowing in the variable-gain amplifier circuit A1. In this way, the variable-gain amplifier of the fifth embodiment operates in a similar manner to the variable-gain amplifier of the fourth embodiment, and in addition it operates with smaller errors in the bias currents $I_{A1}$ and $I_{A2}$ than in the variable-gain amplifier of the fourth embodiment.

Figure 14:
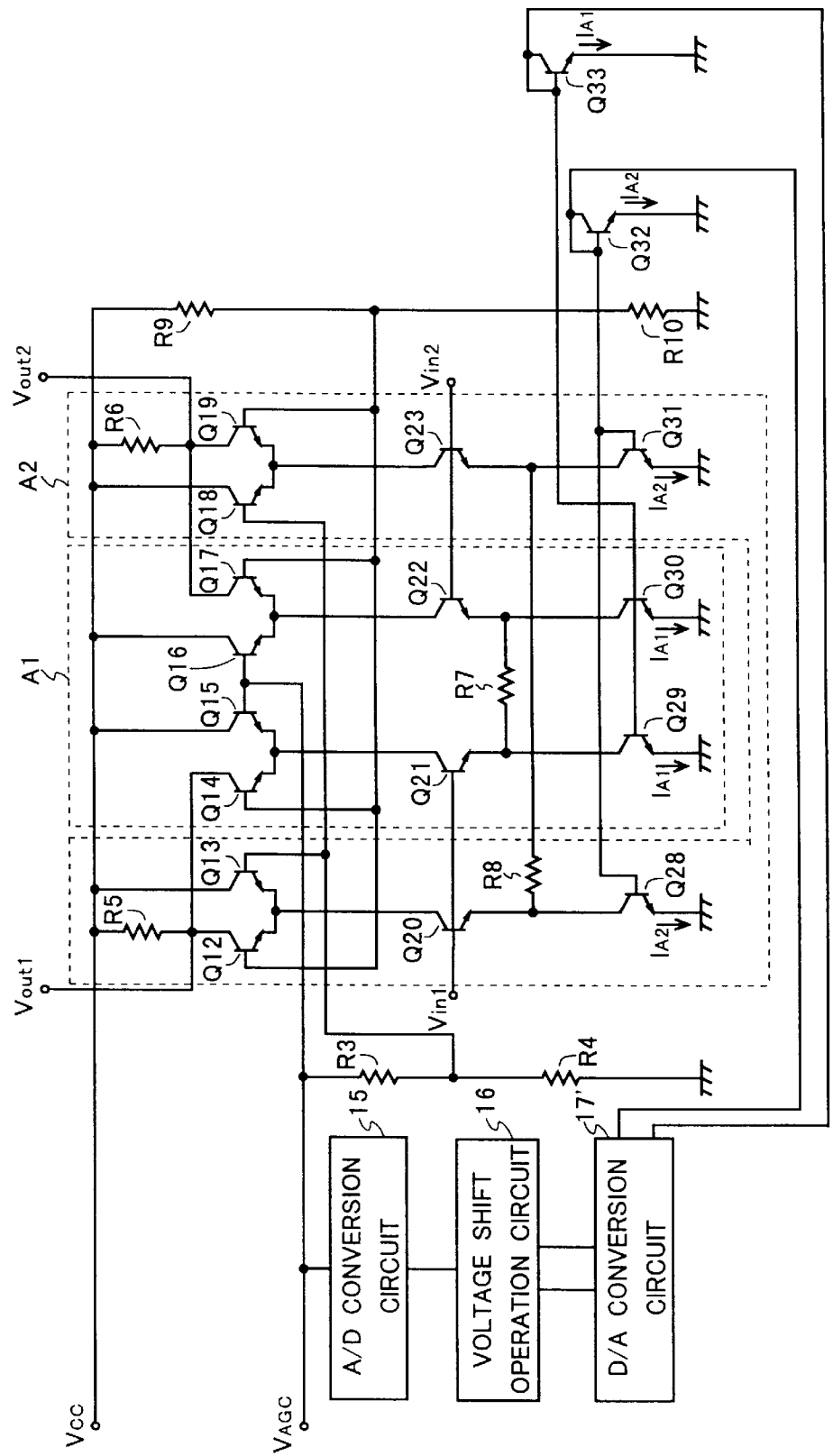
FIG. 14 is a diagram showing the configuration of the variable-gain amplifier of a sixth embodiment of the invention.

Next, the variable-gain amplifier of a sixth embodiment of the invention will be described. FIG. 14 shows the configuration of the variable-gain amplifier of the sixth embodiment. It is to be noted that such circuit elements and signals as are found also in FIG. 13 are identified with the same reference numerals and symbols, and their explanations will not be repeated.

An A/D conversion circuit 15 converts the control voltage $V_{AGC}$ as represented by an analog value into a voltage as represented by a digital value, and outputs the result to a voltage shift operation circuit 16. The voltage shift operation circuit 16 shifts, by different predetermined values, the voltage as represented by the digital value output from the A/D conversion circuit 15 so as to output different voltages $V_{D1}'$ and $V_{D2}'$ as represented by digital values to a D/A conversion circuit 17'. The D/A conversion circuit 17' is provided with voltage-to-current conversion amplifiers (not shown) so that it first converts the voltages $V_{D1}'$ and $V_{D2}'$ as represented by the digital values into voltages as represented by analog values, respectively, then converts, with the voltage-to-current conversion amplifiers (not shown), those voltages as represented by the analog values into currents $I_{A1}$ and $I_{A2}$ as represented by analog values, and then outputs the current $I_{A1}$ to the collector of the transistor Q33 and the current $I_{A2}$ to the collector of the transistor Q32.

Here, the predetermined values by which the voltage shift operation circuit 16 shifts the voltage fed to it to calculate the voltages $V_{D1}'$ and $V_{D2}'$ as represented by digital values are so set that the threshold level of the control voltage $V_{AGC}$ at which the differential amplifier circuit composed of the transistors Q14 and Q15 and the differential amplifier circuit composed of the transistors Q16 and Q17 start gain attenuation is equal to the threshold level of the control voltage $V_{AGC}$ at which the bias current $I_{A2}$ starts flowing in the variable-gain amplifier circuit A2, and that the threshold level of the control voltage $V_{AGC}$ at which the differential amplifier circuit composed of the transistors Q12 and Q13 and the differential amplifier circuit composed of the transistors Q18 and Q19 start gain attenuation is equal to the threshold level of the control voltage $V_{AGC}$ at which the bias current $I_{A1}$ almost stops flowing in the variable-gain amplifier circuit A1. In this way, the variable-gain amplifier of the sixth embodiment operates in a similar manner to the variable-gain amplifiers of the fourth and fifth embodiments, and in addition it operates with smaller errors in the bias currents $I_{A1}$ and $I_{A2}$ than in the variable-gain amplifier of the fourth embodiment.

Figure 15A:
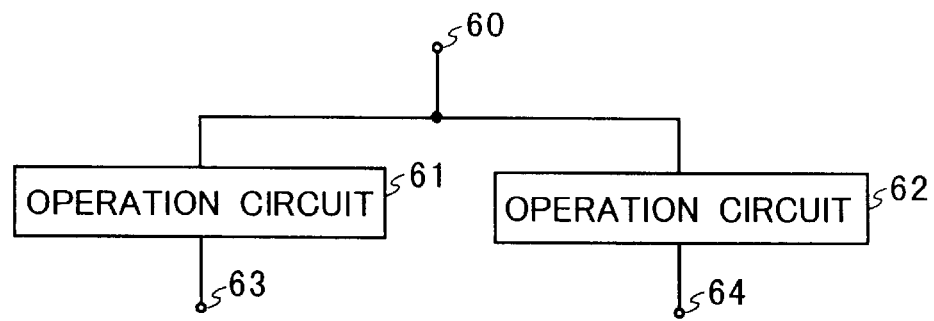
FIG. 15A is a diagram showing a practical example of the voltage shift operation circuit provided in the variable-gain amplifiers of the fifth and sixth embodiments.

Now, practical examples of the voltage shift operation circuit 16 provided in the variable-gain amplifiers of the fifth and sixth embodiments described above will be described. FIG. 15A shows the voltage shift operation circuit 16 that is so configured as to perform different operations on a parallel basis, and FIG. 15B shows the voltage shift operation circuit 16 that is so configured as to perform different operations on a time division basis.

First, the voltage shift operation circuit shown in FIG. 15A will be described. The voltage as represented by the digital value output from the A/D conversion circuit 15 is fed to a terminal 60. An operation circuit 61 performs digital operation to subtract a predetermined shift value $\Delta V1$ from the value of the voltage fed to the terminal 60, and outputs the result of the operation to a terminal 63. Moreover, an operation circuit 62 performs digital operation to subtract a predetermined shift value $\Delta V2$ from the value of the voltage fed to the terminal 60, and outputs the result of the operation to a terminal 64.

Next, the voltage shift operation circuit shown in FIG. 15B will be described. The voltage as represented by the digital value output from the A/D conversion circuit 15 is fed to a terminal 65. A control circuit 67 controls the contact state of a switch 66. This voltage shift operation circuit performs operation through the following procedure. First, the switch 66 is turned to a contact "a." In this state, an operation circuit 68 performs digital operation to subtract a predetermined shift value $\Delta V1$ from the value of the voltage fed to the terminal 65, and outputs the result of the operation to a terminal 69. Thereafter, the switch 66 is turned to a contact "b." In this state, the operation circuit 68 performs digital operation to subtract the predetermined shift value $\Delta V1$ from the value of the voltage that the operation circuit 68 itself has just output, that is, it performs digital operation to subtract twice the predetermined shift value $\Delta V1$ from the value of the voltage fed to the terminal 65. Thereafter, the switch 66 is turned back to the contact "a" to end the operation. This configuration requires only one operation circuit, and thus helps reduce the circuit scale. This configuration is especially useful in a case where a number of variable-gain amplifier circuits are provided as described later.

Figure 15B:
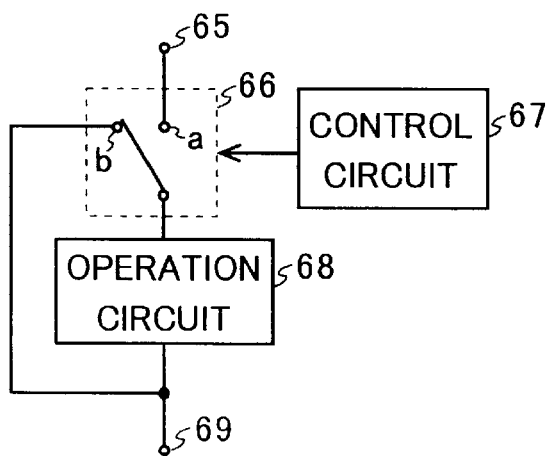
FIG. 15B is a diagram showing another practical example of the voltage shift operation circuit provided in the variable-gain amplifiers of the fifth and sixth embodiments.

When the voltage shift operation circuit 16 is so configured as to perform different operations on a time division basis as shown in FIG. 15B, it is advisable to configure also the D/A conversion circuit 17 or 17' so as to perform conversion on a time division basis. This makes it possible to reduce also the circuit scale of the D/A conversion circuit 17 or 17'.

In the variable-gain amplifiers of the fifth and sixth embodiments described above, for simplicity's sake, two variable-gain amplifier circuits are connected in parallel. In practice, however, to make the gain characteristic with respect to the control voltage $V_{AGC}$ smooth, it is preferable to connect more variable-gain amplifier circuits in parallel. Moreover, to reduce the error in the voltage fed to the bases of the transistors Q13 and Q18, the voltage shift circuit composed of the resistors R3 ad R4 may be replaced with a voltage shift circuit composed of an A/D conversion circuit, a voltage shift operation circuit, and a D/A conversion circuit.

In the variable-gain amplifiers of the fourth to sixth embodiments described above, the bias currents $I_{A1}$ and $I_{A2}$ are controlled according to the control voltage $V_{AGC}$. However, the present invention may be implemented with any other configuration. For example, it is also possible to control the bias currents $I_{A1}$ and $I_{A2}$ according to a control voltage fed from outside which is independent of the control voltage $V_{AGC}$.

What is claimed is:

1. A variable-gain amplifier comprising:
   a first differential amplifier circuit having first and second transistors, a differential input voltage being applied between bases of the first and second transistors;
   a second differential amplifier circuit having third and fourth transistors of which emitters are connected to a collector of the first transistor, the second differential amplifier circuit outputting a signal amplified by the first transistor after attenuating the signal according to a voltage applied between bases of the third and fourth transistors;
   a third differential amplifier circuit having fifth and sixth transistors of which emitters are connected to a collector of the second transistor, the third differential amplifier circuit outputting a signal amplified by the second transistor after attenuating the signal according to a voltage applied between bases of the fifth and sixth transistors;

a first controller for controlling operation of the first transistor; and a second controller for controlling operation of the second transistor, wherein the first controller controls the operation of the first transistor stepwise from an active state to an off state, and the second controller controls the operation of the second transistor stepwise from an active state to an off state.

2. A variable-gain amplifier comprising:

a first differential amplifier circuit having first and second transistors, a differential input voltage being applied between bases of the first and second transistors;

a second differential amplifier circuit having third and fourth transistors of which emitters are connected to a collector of the first transistor, the second differential amplifier circuit outputting a signal amplified by the first transistor after attenuating the signal according to a voltage applied between bases of the third and fourth transistors;

a third differential amplifier circuit having fifth and sixth transistors of which emitters are connected to a collector of the second transistor, the third differential amplifier circuit outputting a signal amplified by the second transistor after attenuating the signal according to a voltage applied between bases of the fifth and sixth transistors;

a first controller for controlling operation of the first transistor; and a second controller for controlling operation of the second transistor, wherein the first controller controls an emitter potential of the first transistor according to a first control signal fed in from outside, and the second controller controls an emitter potential of the second transistor according to a second control signal fed in from outside.

3. A variable-gain amplifier comprising:

a first differential amplifier circuit having first and second transistors, a differential input voltage being applied between bases of the first and second transistors;

a second differential amplifier circuit having third and fourth transistors of which emitters are connected to a collector of the first transistor, the second differential amplifier circuit outputting a signal amplified by the first transistor after attenuating the signal according to a voltage applied between bases of the third and fourth transistors;

a third differential amplifier circuit having fifth and sixth transistors of which emitters are connected to a collector of the second transistor, the third differential amplifier circuit outputting a signal amplified by the second transistor after attenuating the signal according to a voltage applied between bases of the fifth and sixth transistors;

a first controller for controlling operation of the first transistor; and a second controller for controlling operation of the second transistor, wherein the first controller controls an emitter potential of the first transistor according to a first control signal fed in from outside, and the second controller controls an emitter potential of the second transistor according to a second control signal fed in from outside, wherein the first controller is composed of a seventh transistor of which an emitter is connected to an emitter of the first transistor, the seventh transistor feeding out an emitter current according to the first control signal applied to a base thereof, and the second controller is composed of an eighth transistor of which an emitter is connected to an emitter of the second transistor, the eighth transistor feeding out an emitter current according to the second control signal applied to a base thereof.

4. A variable-gain amplifier comprising:

a first differential amplifier circuit having first and second transistors, a differential input voltage being applied between bases of the first and second transistors;

a second differential amplifier circuit having third and fourth transistors of which emitters are connected to a collector of the first transistor, the second differential amplifier circuit outputting a signal amplified by the first transistor after attenuating the signal according to a voltage applied between bases of the third and fourth transistors;

a third differential amplifier circuit having fifth and sixth transistors of which emitters are connected to a collector of the second transistor, the third differential amplifier circuit outputting a signal amplified by the second transistor after attenuating the signal according to a voltage applied between bases of the fifth and sixth transistors;

a first controller for controlling operation of the first transistor; and a second controller for controlling operation of the second transistor, wherein, when a gain is equal to or higher than a predetermined value, the first and second controllers are brought into an off state.

5. A variable-gain amplifier comprising:

a plurality of variable-gain amplifier circuits connected in parallel;

a voltage shift circuit for producing, from a reference control voltage fed in from outside, a first control voltage for each of the variable-gain amplifier circuits; and a current control circuit for controlling bias currents for each of the variable-gain amplifier circuits, wherein the plurality of variable-gain amplifier circuits each comprise:

a first differential amplifier circuit having first and second transistors and current sources, a differential input voltage being applied between bases of the first and second transistors, the current sources outputting bias currents to supply currents to the first and second transistors;

a second differential amplifier circuit having third and fourth transistors of which emitters are connected to a collector of the first transistor, the second differential amplifier circuit outputting a signal amplified by the first transistor after attenuating the signal according to a difference between the first control voltage applied to a base of the third transistor and a bias voltage applied to a base of the fourth transistor;

a third differential amplifier circuit having fifth and sixth transistors of which emitters are connected to a collector of the second transistor, the third differential amplifier circuit outputting a signal amplified by the second transistor after attenuating the signal according to a difference between the first control voltage applied to a base of the fifth transistor and the bias voltage applied to a base of the sixth transistor.

6. A variable-gain amplifier as claimed in claim 5, wherein the current control circuit comprises:
- a control voltage shift circuit for producing, from the reference control voltage, a second control voltage that shifts by a predetermined voltage with respect to the first control voltage for each of the variable-gain amplifier circuits;
- a bias voltage shift circuit for producing, from the bias voltage, a second bias voltage that shifts by the predetermined voltage with respect to the bias voltage for each of the variable-gain amplifier circuits; and
- a control circuit for controlling bias currents for each of the variable-gain amplifier circuits according to a difference between the second control voltage and the second bias voltage.

7. A variable-gain amplifier as claimed in claim 6, wherein the second control voltage is lower than the reference control voltage.

8. A variable-gain amplifier as claimed in claim 7, wherein the control voltage shift circuit includes a plurality of impedance devices connected in series, a voltage at a node between every two adjacent ones of the impedance devices being used as the second control voltage.

9. A variable-gain amplifier as claimed in claim 8, wherein the impedance devices are resistors.

10. A variable-gain amplifier as claimed in claim 6, wherein the control voltage shift circuit comprises:
- an A/D conversion circuit for converting the reference control voltage from an analog value to a digital value;
- an operation circuit for performing a digital operation on the reference control voltage as represented by the digital value output from the A/D conversion circuit so as to produce the second control voltage as represented by a digital value for each of the variable-gain amplifier circuits; and
- a D/A conversion circuit for converting the second control voltage output from the operation circuit from the digital value to an analog value for each of the variable-gain amplifier circuits.

11. A variable-gain amplifier as claimed in claim 10, wherein the operation circuit performs the digital operation on a time division basis.

12. A variable-gain amplifier as claimed in claim 11, wherein the D/A conversion circuit performs the conversion on a time division basis.

13. A variable-gain amplifier as claimed in claim 5, wherein the current control circuit comprises:
- an A/D conversion circuit for converting the reference control voltage from an analog value to a digital value;
- an operation circuit for performing a digital operation on the reference control voltage as represented by the digital value output from the A/D conversion circuit so as to produce a third control voltage as represented by a digital value for each of the variable-gain amplifier circuits; and
- a D/A conversion circuit for converting the third control voltage output from the operation circuit from the digital value to a current as represented by an analog value for each of the variable-gain amplifier circuits.

14. A variable-gain amplifier as claimed in claim 13, wherein the operation circuit performs the digital operation on a time division basis.

15. A variable-gain amplifier as claimed in claim 14, wherein the D/A conversion circuit performs the conversion on a time division basis.

16. A variable-gain amplifier as claimed in claim 5, wherein the current control circuit reduces bias currents in the variable-gain amplifier circuits to zero according to the reference control voltage.

17. A variable-gain amplifier as claimed in claim 16, wherein which one of the variable-gain amplifier circuits to operate is switched according to the reference control voltage, and a range of the reference control voltage is secured in which, when the variable-gain amplifier circuits are switched from one to another, the variable-gain amplifier that is going to stop being operated and the variable-gain amplifier that is going to start being operated both operate concurrently.

* * * * *